United States Patent
Tamura et al.

(10) Patent No.: US 7,195,857 B2
(45) Date of Patent: Mar. 27, 2007

(54) RESIST CURABLE RESIN COMPOSITION AND CURED ARTICLE THEREOF

(75) Inventors: Kenji Tamura, Kawasaki (JP); Motoyuki Hirata, Hiratsuka (JP); Eikichi Kogure, Yokohama (JP); Kenichi Yamada, Yokohama (JP)

(73) Assignee: Showa Denko K.K., Tokyo (JP)

( * ) Notice: Subject to any disclaimer, the term of this patent is extended or adjusted under 35 U.S.C. 154(b) by 390 days.

(21) Appl. No.: 10/363,029

(22) PCT Filed: Jun. 28, 2002

(86) PCT No.: PCT/JP02/06559

§ 371 (c)(1),
(2), (4) Date: Feb. 28, 2003

(87) PCT Pub. No.: WO03/005126

PCT Pub. Date: Jan. 16, 2003

(65) Prior Publication Data

US 2004/0009428 A1    Jan. 15, 2004

Related U.S. Application Data

(60) Provisional application No. 60/330,816, filed on Oct. 31, 2001, provisional application No. 60/304,428, filed on Jul. 12, 2001.

(30) Foreign Application Priority Data

Jul. 4, 2001  (JP) .............................. 2001-203518
Oct. 25, 2001  (JP) .............................. 2001-327945

(51) Int. Cl.
  G03C 1/73   (2006.01)
  G03C 1/74   (2006.01)
  G03C 1/795  (2006.01)
  G03F 7/027  (2006.01)
  G03F 7/30   (2006.01)
  G03F 7/40   (2006.01)

(52) U.S. Cl. .................. 430/280.1; 430/281.1; 430/285.1; 430/286.1; 430/287.1; 430/288.1; 430/9; 430/18; 430/325; 430/271.1; 430/311; 430/319; 430/330

(58) Field of Classification Search .......... 430/270.1, 430/286.1, 287.1, 288.1, 281.1, 285.1, 280.1, 430/284.1, 9, 18, 325, 326, 330, 271.1, 275.1, 430/311, 319, 916, 942, 966
See application file for complete search history.

(56) References Cited

U.S. PATENT DOCUMENTS

| 4,544,623 | A  |   | 10/1985 | Audykowski et al. |
| 4,943,516 | A  | * | 7/1990  | Kamayachi et al. ..... 430/280.1 |
| 5,418,112 | A  | * | 5/1995  | Mirle et al. ................. 430/269 |
| 6,251,990 | B1 | * | 6/2001  | Meguriya et al. ........... 524/862 |

FOREIGN PATENT DOCUMENTS

| EP | 1 229 389 A1 | * | 8/2002 |
| JP | 1-54390 |   | 11/1989 |
| JP | 7-278492 |   | 10/1995 |
| JP | 9-235449 |   | 9/1997 |
| JP | 9-325490 |   | 12/1997 |
| JP | 10-306201 |   | 11/1998 |
| JP | 11-242331 |   | 9/1999 |
| JP | 11-271967 |   | 10/1999 |
| WO | WO 01 29616 A |   | 4/2001 |

OTHER PUBLICATIONS

Machine-Assisted English Translation of JP 2000-306429 (Takanezawa et al), provided by JPO.*
Full English translation of JP 2000-306429 (Takanezawa et al), provided by PTO.*
Database WPI. Section Ch, Week 199239. Derwent Publications Ltd., London, GB; An 1992-320343 XP002217499 and JP 4-225079 A (Aug. 14, 1992).
Database WPI. Section Ch, Week 200120. Derwent Publications Ltd., London, GB; An 2001-193915 XP002217500 and JP 2000-306429 A (Nov. 2, 2000).

* cited by examiner

*Primary Examiner*—Sin Lee
(74) *Attorney, Agent, or Firm*—Sughrue Mion, PLLC

(57) ABSTRACT

A resist curable resin material composed mainly of a curable prepolymer (for example, a photocurable resin material comprising a photosensitive prepolymer having an ethylenically unsaturated terminal group originating in an acrylic monomer (A), a compound having an ethylenically unsaturated group excluding the photosensitive prepolymer (B), and a photopolymerization initiator (C)) and a flame-retarding agent containing a hydrated metal compound and a brominated epoxy compound are mixed to produce a resist curable resin composition. Alternatively, the resist curable resin material described above and a hydrated metal compound surface-treated with a surface treating agent having an amphipathic property and a polarity are mixed to produce a resist curable resin composition.

35 Claims, No Drawings

RESIST CURABLE RESIN COMPOSITION AND CURED ARTICLE THEREOF

This application claims the benefit pursuant to 35 U.S.C. §109 (e)(1) of U.S. Provisional Applications No. 60/304,428 filed on Jul. 12, 2001 and No. 60/330,816 filed on Oct. 31, 2001.

TECHNICAL FIELD

The present invention relates to a resist curable resin composition for forming a protective film, which is used to produce a printed circuit board, and use thereof.

BACKGROUND ART

In the manufacture of printed circuit boards, various substrate protecting means, such as resist used in the etching step and solder resist used in the soldering step, have conventionally been required. Also in the manufacturing process of a film-like printed circuit board (flexible printed circuit board abbreviated as FPC) used in small equipment, a solder resist for protecting independent wirings is required in the soldering step for mounting parts.

As a protective means for these substrates, there has conventionally been used a cover-layer for laminating those obtained by punching out a polyimide film into a predetermined shape, or a cover-coat made of a heat-resistant material for applying ink. This cover-layer or cover-coat also serves as a protective film for wirings after soldering and requires heat resistance during soldering, insulating properties, and sufficient pliability so as not to crack when folded during incorporation of a substrate. An FPC used for purposes other than battery driving equipment also requires flame resistance, and those having good balance with the pliability are required.

The cover-layer formed by punching out the polyimide film meets the above prescribed properties and is used most popularly at present, but has a problem in that the punching out step requires an expensive mold and manual positioning and lamination of the punched out film increase the cost, and moreover, a micropattern is difficult to form. The cover-coat has such a problem in that the manufacturing cost increases because screen printing requires a drying step and the operatability becomes worse.

To solve these problems, there has been proposed a method of applying a photosensitive resin composition on a substrate in the form of a liquid or laminating it in the form of a film. According to this method, since a cover-coat or cover-layer of a micropattern can be easily formed by forming a coating on the substrate and subjecting to the exposure, development, and heating steps using a photographical technique, various photosensitive resin compositions have conventionally been developed.

However, no conventional photosensitive resin composition met all the properties required for an FPC. For example, a photosensitive resin composition comprising a prepolymer obtained by the addition reaction of a novolak type epoxy vinyl ester resin and a polybasic anhydride, a photopolymerization initiator, a diluent and an epoxy compound has been proposed (Japanese Examined Patent Application, Second Publication No. 1-54390). This photosensitive resin composition had good heat resistance and insulating properties, but is not suited for use in an FPC because of poor pliability. Also, there has been proposed a photosensitive resin composition prepared by mixing a binder system composed of a low-molecular weight copolymer (which is a reaction product of a copolymer formed from an ethylenically unsaturated dicarboxylic anhydride and an ethylenically unsaturated comonomer, and an amine) and a carboxylic acid-containing high-molecular weight copolymer with an acrylated urethane monomer component, a photoinitiator and a block polyisocyanate crosslinking agent (Japanese Unexamined Patent Application, First Publication No. 7-278492). However, this photosensitive resin composition had a problem that the use is limited because of its poor flame resistance.

As a method of imparting the flame resistance to the photosensitive resin composition, there have conventionally been used a method of using a halide-based flame retardant such as brominated epoxy resin and a method of using a flame retardant of a combination of the halide-based flame retardant and an auxiliary flame retardant such as antimony trioxide (Japanese Unexamined Patent Application, First Publication No. 9-325490, and Japanese Unexamined Patent Application, First Publication No. 11-242331). However, these flame retardants are inferior in reliability in a high temperature environment and, when using an antimony compound, it is necessary to take into account environmental problems with respect to waste disposal of the resin. Furthermore, the brominated epoxy resin had a problem in that the pliability is impaired when incorporating it in a sufficient amount to obtain a satisfactory flame-retarding effect.

Also, methods of using a phosphate ester as the flame retardant have been proposed (Japanese Unexamined Patent Application, First Publication No. 9-235449, Japanese Unexamined Patent Application, First Publication No. 10-306201, and Japanese Unexamined Patent Application, First Publication No. 11-271967). However, a poor flame-retarding effect is exerted by using only the phosphate ester, and it is impossible to sufficiently meet criteria of the flame resistance according to the UL Standard.

As described above, it is not easy to obtain a resist film, which has both high flame resistance and pliability capable of meeting criteria according to the UL Standard and is also superior in soldering heat resistance, moisture resistance, high temperature reliability, photosensitivity, and developability. Therefore, a further improvement has been required.

DISCLOSURE OF INVENTION

An object of the present invention is to provide a resist curable resin composition, which has both high-level flame resistance and pliability and is superior in soldering heat resistance, moisture resistance, high temperature reliability, photosensitivity and developability, and also has good transparency, particularly a resist curable resin composition which is suited for use as a cover-layer or solder resist for an FPC.

Another object of the present invention is to provide a preferred method for forming a heat-resistant protective film using the resist curable resin composition described above.

The present inventors have intensively studied and found that the problems described above can be solved by using a flame-retarding agent having a specific composition, and thus the present invention has been completed.

The present invention provides a resist curable resin composition comprising a resist curable resin material and a hydrated metal compound.

The first aspect of the present invention is a resist curable resin composition wherein a brominated epoxy compound is incorporated into the constitution described above.

According to the aspect described above, a resist curable resin composition having excellent flame resistance, photosensitivity, developability, pliability, and soldering heat resistance is obtained.

The second aspect of the present invention is a resist curable resin composition wherein the hydrated metal compound is surface-treated with a surface treating agent having at least one of an amphipathic property and a polarity.

According to the aspect described above, a resist curable resin composition having excellent flame resistance, photosensitivity, developability, and folding resistance is obtained.

BEST MODE FOR CARRYING OUT THE INVENTION

The present invention will be described in detail below.

A resist curable resin composition as the first embodiment of the present invention comprises a resist curable resin material and a flame retarder.

I-1. Resist Curable Resin Material

The resist curable resin material used in the first embodiment is mainly composed of a curable prepolymer. As used herein, the curable resin material may be any curable material which is used as a resist resin material such as a photocurable resin material, an electron beam curable resin material, an X-ray curable resin material, or a thermocurable resin material.

(i) Photocurable Resin Material

The photocurable resin material is not specifically limited as long as it can be cured by visible light, ultraviolet light, or the like, and preferably comprises a photosensitive prepolymer having an ethylenically unsaturated terminal group originating in an acrylic monomer (A-1), a compound having an ethylenically unsaturated group (B) excluding the photosensitive prepolymer (A-1), and a photopolymerization initiator (C).

(1) Photosensitive Prepolymer (A-1)

The photosensitive prepolymer (A-1) used in the first embodiment has an ethylenically unsaturated terminal group originating in an acrylic monomer. As used herein, the acrylic monomer is acrylic acid or methacrylic acid (hereinafter acrylic acid and methacrylic acid are generically referred to as "(meth)acrylic acid") or a derivative thereof such as alkyl ester or hydroxyalkyl ester.

The photosensitive prepolymer (A-1) as the first embodiment is not specifically limited as long as it meets the conditions described above, and specific examples thereof include polyester acrylate, epoxy acrylate, urethane acrylate, polybutadiene acrylate, silicone acrylate, and melamine acrylate. Among these, epoxy acrylate and urethane acrylate are preferred.

Those having at least one carboxyl group and two ethylenically unsaturated bonds in a molecule are more preferred. Specific examples of particularly preferred one include epoxy (meth)acrylate compound having a carboxyl group (EA) and urethane (meth)acrylate compound having a carboxyl group (UA).

<Epoxy (Meth)Acrylate Compound Having a Carboxyl Group (EA)>

The epoxy (meth)acrylate compound having a carboxyl group in the first embodiment is not specifically limited, and for example, an epoxy (meth)acrylate compound obtained by reacting a reaction product of an epoxy compound and an unsaturated group-containing monocarboxylic acid with an acid anhydride is preferred.

The epoxy compound is not specifically limited, and examples thereof include epoxy compounds such as bisphenol A type epoxy compound, bisphenol F type epoxy compound, bisphenol S type epoxy compound, phenol novolak type epoxy compound, cresol novolak type epoxy compound, or aliphatic epoxy compound. These epoxy compounds can be used alone, or two or more kinds of them can be used in combination.

Examples of the unsaturated group-containing monocarboxylic acid include acrylic acid, dimer of acrylic acid, methacrylic acid, β-furfurylacrylic acid, β-styrylacrylic acid, cinnamic acid, crotonic acid, α-cyanocinnamic acid, and the like. It further includes a hemiester compound as a reaction product of a hydroxyl group-containing acrylate such as hydroxyalkyl ester of (meth)acrylic acid and a saturated or unsaturated dibasic acid anhydride, or a hemiester compound as a reaction product of an unsaturated group-containing monoglycidyl ether and a saturated or unsaturated dibasic acid anhydride. These unsaturated group-containing monocarboxylic acids can be used alone, or two or more kinds of them can be used in combination.

Examples of the acid anhydride include dibasic acid anhydride such as maleic anhydride, succinic anhydride, itaconic anhydride, phthalic anhydride, tetrahydrophthalic anhydride, hexahydrophthalic anhydride, methylhexahydrophthalic anhydride, endomethylenetetrahydrophthalic anhydride, methylendomethylenetetrahydrophthalic anhydride, chlorendic anhydride, or methyltetrahydrophthalic anhydride; aromatic polyhydric carboxylic anhydride such as trimellitic anhydride, pyromellitic anhydride, or benzophenonetetracarboxylic dianhydride; and polyhydric carboxylic anhydride derivative such as 5-(2,5-dioxotetrahydrofuryl)-3-methyl-3-cyclohexene-1,2-dicarboxylic anhydride, or endobicyclo-[2,2,1]-hept-5-ene-2,3-dicarboxylic anhydride. These acid anhydrides can be used alone, or two or more kinds of them can be used in combination.

The molecular weight of the epoxy (meth)acrylate compound having a carboxyl group thus obtained is not specifically limited, but the number-average molecular weight is preferably within a range from 1,000 to 40,000, and more preferably from 2,000 to 5,000. As used herein, the number-average molecular weight is a value as measured by a gel permeation chromatograph relative to polystyrene standards.

The acid value (which means an acid value of the solid content) of the epoxy (meth)acrylate compound is preferably 10 mg KOH/g or more, more preferably within a range from 45 mg KOH/g to 160 mg KOH/g, and particularly preferably from 50 mg KOH/g to 140 mg KOH/g because of good balance between the alkali solubility and the alkali resistance of the cured film. When the acid value is less than 10 mg KOH/g, the alkali solubility becomes poor. On the other hand, when the acid value is too large, the alkali resistance of the cured film and characteristics as a resist such as electrical characteristics are sometimes lowered, depending on the combination of constituent components of the resist curable resin composition.

The epoxy (meth)acrylate compound having a carboxyl group may be used alone, thereby to constitute the photosensitive prepolymer (A-1), but may be used in combination with a urethane (meth)acrylate compound having a carboxyl group described hereinafter. In that case, the epoxy (meth)acrylate compound having a carboxyl group is preferably used in an amount of 100 parts by weight or less based on 100 parts by weight of the urethane (meth)acrylate compound having a carboxyl group.

<Urethane (Meth)Acrylate Compound Having a Carboxyl Group (UA)>

The urethane (meth)acrylate compound having a carboxyl group in the first embodiment is a compound containing a unit originating in a (meth)acrylate having a hydroxyl group, a unit originating in a polyol and a unit originating in a polyisocyanate as a constituent unit. More specifically, it is a compound having such a structure that both terminals are composed of a unit originating in a (meth)acrylate having a hydroxyl group and a portion between both terminals is composed of a repeating unit comprising a unit originating in a polyol and a unit originating in a polyisocyanate, which are linked with a urethane bond, and carboxyl groups exist in this repeating unit.

That is, the urethane (meth)acrylate compound having a carboxyl group is represented by the formula: Ra—(ORbO—OCNHRcNHCO)$_n$—Ra [wherein Ra represents a unit originating in a (meth)acrylate having a hydroxyl group, ORbO represents a dehydrogenated residue of a polyol, and Rc represents a deisocyanated residue of a polyisocyanate].

The urethane (meth)acrylate compound having a carboxyl group can be prepared by reacting a (meth)acrylate having at least a hydroxyl group, a polyol and a polyisocyanate. It is necessary to use a compound having a carboxyl group as the polyol or polyisocyanate. Preferably, a polyol having a carboxyl group is used. The use of the compound having a carboxyl group as the polyol and/or polyisocyanate makes it possible to prepare a urethane (meth)acrylate compound wherein carboxyl groups exist in Rb or Rc. In the formula described above, n is preferably from about 1 to 200, and more preferably from 2 to 30. When n is within such a range, the cured film made of the resist curable resin composition is more superior in pliability.

When using two or more kinds of at least one of the polyol and polyisocyanate, the repeating unit represent plural kinds and the regularity of plural units can be appropriately selected according to purposes such as complete random, block, localization, and the like.

Examples of the (meth)acrylate having a hydroxyl group used in the urethane (meth)acrylate compound having a carboxyl group (UA) include 2-hydroxyethyl (meth)acrylate, hydroxypropyl (meth)acrylate, hydroxybutyl (meth)acrylate, caprolactone or alkylene oxide adduct of the respective (meth)acrylates described above, glycerin mono (meth)acrylate, glycerin di(meth)acrylate, glycidyl methacrylate acrylic acid adduct, trimethylolpropane mono (meth)acrylate, trimethylol di(meth)acrylate, pentaerythritol tri(meth)acrylate, dipentaerythritolpenta(meth)acrylate, ditrimethylolpropane tri(meth)acrylate, and trimethylolpropane alkylene oxide adduct-di(meth)acrylate.

These (meth)acrylates having a hydroxyl group can be used alone, or two or more kinds of them can be used in combination. Among these (meth)acrylates having a hydroxyl group, 2-hydroxyethyl (meth)acrylate, hydroxypropyl (meth)acrylate and hydroxybutyl (meth)acrylate are preferred, and 2-hydroxyethyl (meth)acrylate is more preferred. When using 2-hydroxyethyl (meth)acrylate, it is easier to synthesize the urethane (meth)acrylate compound having a carboxyl group (UA).

As the polyol used in the urethane (meth)acrylate compound having a carboxyl group (UA), a polymer polyol and/or a dihydroxyl compound can be used. Examples of the polymer polyol include polyether-based diol such as polyethylene glycol, polypropylene glycol, or polytetramethylene glycol; polyester-based polyol obtained from an ester of a polyhydric alcohol and a polybasic acid; polycarbonate-based diol containing a unit originating in hexamethylene carbonate or pentamethylene carbonate as a constituent unit; and polylactone-based diol such as polycaprolactonediol or polybutyrolactonediol.

When using the polymer polyol having a carboxyl group, there can be used a compound synthesized by making carboxyl groups to remain by synthesizing the polymer polyol in the co-presence of a tri- or polyvalent polybasic acid such as (anhydrous) trimellitic acid.

These polymer polyols can be used alone, or two or more kinds of them can be used in combination. When using polymer polyols having a number-average molecular weight of 200 to 2,000, the cured film made of the resist curable resin composition is more superior in pliability. Therefore, it is preferred. When using polycarbonate diol among these polymer polyols, the cured film made of the resist curable resin composition has high heat resistance and is superior in pressure cooker resistance. Therefore, it is preferred. When the constituent unit of the polymer polyol is not composed of only a single constituent unit, but is composed of plural constituent units, the cured film made of the resist curable resin composition is more superior in pliability. Therefore, it is preferred. Examples of the polymer polyol composed of plural constituent units include polyether-based diol containing units originating in ethylene glycol and propylene glycol as a constituent unit, and polycarbonate diol containing units originating in hexamethylene carbonate and pentamethylene carbonate as a constituent unit.

As the dihydroxyl compound, a branched or straight-chain compound having two alcoholic hydroxyl groups can be used. It is particularly preferred to use an aliphatic dihydroxycarboxylic acid having a carboxyl group. Examples of the dihydroxyl compound include dimethylolpropionic acid and dimethylolbutanoic acid. By using the aliphatic dihydroxycarboxylic acid having a carboxyl group, it is possible to easily make carboxyl groups to exist in the urethane (meth)acrylate compound.

These dihydroxyl compounds can be used alone, or two or more kinds of them may be used in combination or be used in combination with the polymer polyol.

When using the polymer polyol having a carboxyl group in combination or using those having a carboxyl group as polyisocyanate described hereinafter, there can be used a dihydroxyl compound having no carboxyl group, such as ethylene glycol, diethylene glycol, propylene glycol, 1,4-butanediol, 1,3-butanediol, 1,5-pentanediol, neopentyl glycol, 3-methyl-1,5-pentanediol, 1,6-hexanediol, 1,4-cyclohexanedimethanol, or hydroquinone.

Specific examples of the polyisocyanate used in the urethane (meth)acrylate compound having a carboxyl group (UA) include diisocyanate such as 2,4-toluene diisocyanate, 2,6-toluene diisocyanate, isophorone diisocyanate, hexamethylene diisocyanate, diphenylmethylene diisocyanate, (o, m, or p)-xylene diisocyanate, methylenebis(cyclohexylisocyanate), trimethylhexamethylene diisocyanate, cyclohexane-1,3-dimethylene diisocyanate, cyclohexane-1,4-dimethylene diisocyanat, or 1,5-naphthalene diisocyanate. These polyisocyanates can be used alone, or two or more kinds of them can be used in combination. A polyisocyanate having a carboxyl group can also be used.

The molecular weight of the urethane (meth)acrylate compound having a carboxyl group (UA) used in the first embodiment is not specifically limited, but the number-average molecular weight of the urethane (meth)acrylate compound (UA) is preferably within a range from 1,000 to 40,000, and more preferably from 8,000 to 30,000. As used herein, the number-average molecular weight is a value as measured by gel permeation chromatography relative to polystyrene standards. The acid value of the urethane (meth) acrylate is preferably within a range from 5 to 150 mg KOH/g, and more preferably from 30 to 120 mg KOH/g.

When the number-average molecular weight of the urethane (meth)acrylate compound having a carboxyl group is less than 1,000, the elongation and strength of the cured film made of the resist curable resin composition are sometimes impaired. On the other hand, when the number-average molecular weight exceeds 40,000, the pliability is likely to be lowered because the cured film becomes too hard. When the acid value is less than 5 mg KOH/g, the alkali solubility of the resist curable resin composition becomes poor, sometimes. On the other hand, when the acid value exceeds 150 mg KOH/g, the alkali resistance and electrical characteristics of the cured film become poor, sometimes.

The acid value of the urethane (meth)acrylate compound having a carboxyl group is preferably within a range from 5 to 150 mg KOH. Even if the acid value is within the range described above, the developability is improved by increasing the acid value; however, the pliability tends to be lowered. When the acid value is decreased, the pliability is enhanced; however, the developability is lowered and development residue tends to be formed. In that case, when using at least two kinds of urethane (meth)acrylate compounds having a carboxyl group, which have different acid values, in combination, a resist curable resin composition having excellent pliability and good developability can be easily obtained, sometimes.

It is particularly preferred to use at least one kind of a urethane (meth)acrylate compound having a carboxyl group having an acid value of 5 mg KOH/g or more and less than 60 mg KOH/g (hereinafter referred to as a "urethane (meth) acrylate compound (a)") and a urethane (meth)acrylate compound having a carboxyl group, which has an acid value of 60 mg KOH/g or more and 150 mg KOH/g or less (hereinafter referred to as a "urethane (meth)acrylate compound (b)") in combination.

When using urethane (meth)acrylate compounds having a carboxyl group, which have different acid values, in combination, a weight ratio of the urethane (meth)acrylate compound (a) to the urethane (meth)acrylate compound (b) is preferably 40–90:60–10 (100 in total) in 100 parts by weight of the urethane (meth)acrylate compound having a carboxyl group (UA). It is particularly preferred to use an excess amount of the urethane (meth)acrylate compound (a), and a weight ratio of the urethane (meth)acrylate compound (a) to the urethane (meth)acrylate compound (b) is more preferably within a range from 60–90:40–10.

The urethane (meth)acrylate compound having a carboxyl group can be prepared by (1) a method of mixing and reacting a (meth)acrylate having a hydroxyl group, a polyol and a polyisocyanate at a time, (2) a method of reacting a polyol with a polyisocyanate to prepare a urethane isocyanate prepolymer having one or more isocyanate groups in a molecule and reacting the urethane isocyanate prepolymer with a (meth)acrylate having a hydroxyl group, or (3) a method of reacting a (meth)acrylate having a hydroxyl group with a polyisocyanate to prepare a urethane isocyanate prepolymer having one or more isocyanate groups in a molecule and reacting the prepolymer with a polyol.

(2) Compound Having an Ethylenically Unsaturated Group (B)

The compound having an ethylenically unsaturated group contained in the photocuring component in the resist curable resin composition is other than the photosensitive prepolymer (A-1) and is used for the purpose of controlling the viscosity of the resist curable resin composition, or controlling physical properties such as heat resistance and pliability when the cured article is made from the resist curable resin composition. Preferably, a (meth)acrylate ester is used.

Specific examples thereof include alkyl(meth)acrylate such as methyl (meth)acrylate, ethyl (meth)acrylate, propyl (meth)acrylate, butyl (meth)acrylate, isobutyl (meth)acrylate, sec-butyl (meth)acrylate, tert-butyl (meth)acrylate, hexyl (meth)acrylate, octyl (meth)acrylate, isooctyl (meth) acrylate, 2-ethylhexyl (meth)acrylate, decyl (meth)acrylate, lauryl (meth)acrylate, or stearyl (meth)acrylate; alicyclic (meth)acrylate such as cyclohexyl (meth)acrylate, bornyl (meth)acrylate, isobornyl (meth)acrylate, dicyclopentenyl (meth)acrylate, or dicyclopentenyloxyethyl (meth)acrylate; aromatic (meth)acrylate such as benzyl (meth)acrylate, phenyl (meth)acrylate, phenylcarbitol (meth)acrylate, nonylphenyl (meth)acrylate, nonylphenylcarbitol (meth)acrylate, or nonylphenoxy (meth)acrylate; (meth)acrylate having a hydroxyl group, such as 2-hydroxyethyl (meth)acrylate, hydroxypropyl (meth)acrylate, hydroxybutyl (meth)acrylate, butanediolmono (meth)acrylate, glycerol (meth)acrylate, phenoxyhydroxypropyl (meth)acrylate, polyethylene glycol (meth)acrylate, or glycerol di(meth)acrylate; (meth) acrylate having an amino group, such as 2-dimethylaminoethyl (meth)acrylate, 2-diethylaminoethyl (meth)acrylate, or 2-tert-butylaminoethyl (meth)acrylate; methacrylate having a phosphorus atom, such as methacryloxyethyl phosphate, bis methacryloxyethyl phosphate, or methacryloxyethylphenyl acid phosphate (phenyl P); diacrylate such as ethylene glycol di(meth)acrylate, diethylene glycol di(meth)acrylate, triethylene glycol di(meth)acrylate, tetraethylene di(meth) acrylate, polyethylene glycol di(meth)acrylate, propylene glycol di(meth)acrylate, dipropylene glycol di(meth)acrylate, tripropylene glycol di(meth)acrylate, 1,4-butanediol di(meth)acrylate, 1,3-butanediol di(meth)acrylate, neopentyl glycol di(meth)acrylate, 1,6-hexanediol di(meth)acrylate, or bis glycidyl (meth)acrylate; polyacrylate such as trimethylolpropane tri(meth)acrylate, pentaerythritol tri (meth)acrylate, or dipentaerythritol hexa(meth)acrylate; modified polyol polyacrylate such as diacrylate modified with 4 mol of ethylene oxide of bisphenol S, diacrylate modified with 4 mol of ethylene oxide of bisphenol A, fatty acid-modified pentaerythritol diacrylate, triacrylate modified with 3 mol of propylene oxide of trimethylolpropane, or triacrylate modified with 6 mol of propylene oxide of trimethylolpropane; poly acrylate having an isocyanuric acid skeleton, such as bis(acryloyloxyethyl)monohydroxyethyl isocyanurate, tris(acryloyloxyethyl) isocyanurate, or ε-caprolactone-modified tris(acryloyloxyethyl) isocyanurate; polyester acrylate such as α,ω-diacryloyl-(bisethylene glycol)-phthalate or α,ω-tetraacryloyl-(bistrimethylolpropane)-tetrahydrophthalate; glycidyl (meth)acrylate; allyl (meth)acrylate; ω-hydroxyhexanoyloxyethyl (meth)acrylate; polycaprolactone (meth)acrylate; (meth)acryloyloxyethyl phthalate; (meth)acryloyloxyethyl succinate; 2-hydroxy-3-phenoxypropyl acrylate; and phenxyethyl acrylate.

Also an N-vinyl compound such as N-vinylpyrrolidone, N-vinylformamide, or N-vinylacetamide, polyester acrylate, urethane acrylate, and epoxy acrylate can be preferably used as a compound having an ethylenically unsaturated group.

Among these compounds, (meth)acrylate having a hydroxyl group, glycidyl (meth)acrylate and urethane acrylate are preferred. Examples of the (meth)acrylate having a hydroxyl group include 2-hydroxyethyl (meth)acrylate, hydroxypropyl (meth)acrylate, hydroxybutyl (meth)acrylate, and urethane acrylate. Those having three or more ethylenilcally unsaturated groups are preferred because the heat resistance is enhanced.

A mixing ratio of the photosensitive prepolymer (A-1) to the compound having an ethylenically unsaturated group (B), that is, a weight ratio (A-1):(B) is preferably within a range from 95:5 to 50:50, preferably from 90:10 to 60:40, and more preferably from 85:15 to 70:30 (100 in total). When the amount of the component (A-1) exceeds 95% by weight, the soldering heat resistance of the cured film made of the resist curable resin composition is sometimes lowered. On the other hand, when the amount of the component (A-i) is less than 50% by weight, the alkali solubility of the resist curable resin composition tends to be lowered.

(3) Photopolymerization Initiator (C)

Examples of the photopolymerization initiator (C) used in the first embodiment include benzophenones such as benzophenone, benzoylbenzoic acid, 4-phenylbenzophenone, hydroxybenzophenone, and 4,4'-bis(diethylamino)benzophenone; benzoin alkyl ethers such as benzoin, benzoin methyl ether, benzoin ethyl ether, benzoin isopropyl ether, benzoinbutyl ether, and benzoin isobutyl ether; acetophenones such as 4-phenoxydichloroacetophenone, 2-hydroxy-2-methyl-1-phenylpropan-1-one, 1-(4-isopropylphenyl)2-hydroxy-2-methylpropan-1-one, 1-[4-(2-hydroxyethoxy) phenyl]-2-hydroxydi-2-methyl-1-propan-1-one, 1-hydroxycyclohexyl-phenylketone, 2,2-dimethoxy-1,2-diphenylethan-1-one, 2,2-diethoxy-1,2-diphenylethanone, 2-methyl-1-[4-(methylthio)phenyl]-2-morpholinopropanone-1, 4-t-butyldichloroacetophenone, 4-t-butyltrichloroacetophenone, diethoxyacetophenone, 2-benzyl-2-dimethylamino-1-(4-morpholinophenyl)-butanone-1, and 1-phenyl-1,2-propanedione-2-(o-ethoxycarbonyl)oxime; thioxanthenes such as thioxanthene, 2-chlorothioxanthene, 2-methylthioxanthene, and 2,4-dimethylthioxanthene; alkylanthraquinones such as ethylanthraquinone and butylanthraquinone; and acylphosphine oxides such as 2,4,6-trimethylbenzoyldiphenylphosphine oxide. These photopolymerization initiators can be used alone, or two or more kinds of them can be used in combination.

There can also be used photo acid generating agents such as 2,2,2-trichloro-[1-4'-(1,1-dimethylethyl)phenyl]ethanone, 2,2-dichloro-1-4'-(phenoxyphenyl)ethanone, α,α,α-tribromomethylphenylsulfone, 2,4,6-tris(trichloromethyl) triazine, 2,4-trichloromethyl-(4'-methoxyphenyl)-6-triazine, 2,4-trichloromethyl-(4'-methoxystyryl)-6-triazine, 2,4-trichloromethyl-(pipronyl)-6-triazine, 2,4-trichloromethyl-(4'-methoxynaphthyl)-6-triazine, 2[2'(5''-methylfuryl)ethylidene-4,6-bis(trichloromethyl)-S-triazisine, and 2(2'-furyl ethylidene)-4,6-bis(trichloromethyl)-S-triazisine.

If necessary, photosensitizers can be used in combination.

Among these photopolymerization initiators, benzophenones, acetophenones and acylphosphine oxides are preferred. Specific examples thereof include 4,4'-bis(diethylamino)benzophenone, 2-benzyl 2-dimethylamino-1-(4-morpholinophenyl)-butanone-1, and 2,4,6-trimethylbenzoyldiphenylphosphine oxide.

The amount of the photopolymerization initiator (C) is preferably within a range from 0.1 parts by weight to 20 parts by weight, and more preferably from 0.2 parts by weight to 10 parts by weight, based on 100 parts by weight of the total weight of the photocuring component composed of the photosensitive prepolymer (A-1) and the compound having an ethylenically unsaturated group (B). When the amount of the photopolymerization initiator is less than 0.1 parts by weight, curing is sometimes unsatisfactory.

(ii) Electron Beam Curable Resin Material

The electron beam curable resin material used in the first embodiment includes a positive type one and a negative type one, but may be any one as long as it can be used as the resist material. Specific examples thereof include polyvinyl cinnamate, polyvinyl-p-azidebenzoate, polymethyl methacrylate (PMMA), polybutyl methacrylate, methyl methacrylate-methacrylic acid copolymer, methyl methacrylate-acrylonitrile copolymer, methyl methacrylate-isobutylene copolymer, methyl methacrylate-methyl-a-chloroacrylate copolymer, epoxidated 1,4-polybutadiene (EPB), epoxidated polyisoprene, polyglycidyl methacrylate (PGMA), glycidyl methacrylate-ethyl acrylate copolymer, glycidyl methacrylate-styrene copolymer, methylvinylsiloxane, polymethylcyclosiloxane (PMCA), polyvinylsiloxane (PVS), copolymer having an acrylic group on the side chain, polybutadiene (PB), polydiaryl-o-phthalate (PDOP), copolymer having a methacrylic acid group and a glycidyl group on the side chain, alkyl ester of alkylvinyl ether-maleic anhydride copolymer, poly(butene-1-sulfone) (PBS), poly(styrenesulfone), polyvinyl chloride, polystyrene, polyacrylamide, poly-α-methylstyrene, polymethacrylonitrile, cellulose acetate, polyisobutylene, polyvinyl carbazole, polyvinyl ferrocene, polymethyl isopropenyl ketone, polymethacrylamide (PMAA), and poly-a-cyanoethyl acrylate (PCEA).

(iii) X-Ray Curable Resin Material

Specific examples of the X-ray curable resin material used in the first embodiment include polymethyl methacrylate (PMMA), poly(butene-1-sulfone) (PBS), polyvinyl ferrocene (PVFc), polybutadiene (PB), polydiaryl-o-phthalate (PDOP), crosslinking electron resist (CER), epoxidated polybutadiene (EPB), and glycidyl methacrylate-ethyl acrylate copolymer.

(iv) Thermocurable Resin Material

Specific examples of the thermocurable resin material used in the first embodiment include epoxy resin, phenol resin, silicone resin, melamine derivative (for example, hexamethoxymelamine, hexabutoxylated melamine, or condensed hexamethoxymelamine), urea compound (for example, dimethylol urea), bisphenol A-based compound (for example, tetramethylol bisphenol A), oxazoline compound, and oxetane compound. These thermocurable resins can be used alone, or two or more kinds of them can be used in combination.

Among these thermocurable resins, an epoxy resin is preferred. Specific examples of the epoxy resin include epoxy compound having two or more epoxy groups in a molecule, such as bisphenol A type epoxy resin, hydrogenated bisphenol A type epoxy resin, brominated bisphenol A type epoxy resin, bisphenol F type epoxy resin, novolak type epoxy resin, phenol novolak type epoxy resin, cresol novolak type epoxy resin, N-glycidyl type epoxy resin, novolak type epoxy resin of bisphenol A, chelete type epoxy resin, glyoxal type epoxy resin, amino group-containing epoxy resin, rubber modified epoxy resin, dicyclopentadiene phenolic type epoxy resin, silicone modified epoxy resin, or ε-caprolactone modified epoxy resin. Furthermore, bisphenol S type epoxy resin, diglycidyl phthalate resin, heterocyclic epoxy resin, bixylenol type epoxy resin, biphenyl type epoxy resin and tetraglycidylxylenoylethane resin can be used. These epoxy resins can be used alone, or two or more kinds of them can be used in combination.

II-1. Flame-retarding Agent (D)

The flame-retarding agent (D) as the first embodiment contains at least a hydrated metal compound (D1) and a brominated epoxy compound (D2) and, if necessary, it can further contain a phosphate ester compound (D3).

(i) Hydrated Metal Compound (D1)

The hydrated metal compound (D1) used in the first embodiment is a metal compound containing water of crystallization and includes, but is not limited to, those wherein the amount of bound water is within a range from 12 to 60% (% by weight) per mol as measured by thermal analysis.

In view of the flame-retardant effect, a hydrated metal compound causing endothermy upon thermolysis of 400 J/g or higher, and more preferably from 600 to 2500 J/g is used.

Specific examples of the hydrated metal compound include aluminum hydroxide, magnesium hydroxide, calcium hydroxide, dawsonite, calcium aluminate, dihydated gypsum, zinc borate, barium metaborate, zinchydroxystannate, kaolin, and vermiculite.

Among these hydrated metal compounds, aluminum hydroxide or magnesium hydroxide is particularly preferred.

As the hydrated metal compound, a hydrotalcite-based compound, which has a layered crystal structure and also has hydrated anions between crystal layers, is preferably used. As used herein the term "hydrotalcite-based compound" is a generic term including hydrotalcite and a hydrotalcite-like compound described hereinafter.

While hydrotalcite is originally a name given to a natural mineral $Mg_6Al_2(OH)_{16} CO_3 \cdot 4\text{--}5H_2O$, a lot of minerals having the same crystal structure were discovered and also synthesized. They are represented by the following general formulas (a) and (b):

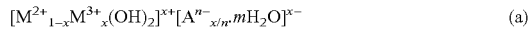   (a)

   (b)

wherein $0.1 \leq x \leq 0.4$, $0 < y < 2$, $0 < m$, n is a natural number of from 1 to 4, $M^{1+}$ is at least one kind of a monovalent metal such as Li, Na, K, Rb, or Cs, $M^{2+}$ is at least one kind of a divalent metal such as Mg, Ca, Mn, Fe, Co, Ni, Cu, or Zn, $M^{3+}$ is at least one kind of a trivalent metal such as Al, Fe, Cr, or In, $A^{n-}$ is at least one kind of an ion-exchanging anion having a valence of n, such as $Cl^-$, $Br^-$, $CO_3^{2-}$, $NO_3^{2-}$, $SO_4^{2-}$, $Fe(CN)_6^{4-}$, tartaric acid ion.

The compound of the general formula (a) wherein $M^{2+}$ is $Mg^{2+}$ and $M^{3+}$ is $Al^{3+}$ is referred to as hydrotalcite, while compounds of the formulas (a) and (b), except the above-mentioned hydrotalcite, are commonly referred to as hydrotalcite-like compounds. It is known that the hydrotalcite and the hydrotalcite-like compound are different in the structural break temperature but are the same in that the structures of these materials comprise positively charged base layers and interlayers containing anions capable of neutralizing the positive charges and water of crystallization, and they have almost the same characteristics. These compounds are described in detail in "Smectite Research Society Bulletin", 'Smectite' (Vol. 6, No. 1, pp. 12–26, 1996, May).

Specific examples of the hydrotalcite-like compound include stichtite, pyroaurite, reevesite, takovite, honessite, and iowaite.

The particle size of the hydrated metal compound used in the first embodiment is not specifically limited, but the average particle diameter is preferably 40 μm or less, and more preferably 2 μm or less. When the average particle diameter exceeds 40 μm, the transparency of the resist cured film becomes poor and, therefore, the light transmittance is lowered and the appearance and smoothness of the surface of the coating film are sometimes impaired. When using the hydrotalcite-based compound, the size, that is, the average particle diameter of the crystal grain, is preferably 10 μm or less, and more preferably 5 μm. When the average particle diameter exceeds 10 μm, the light transmittance of the cured film is lowered and warp is likely to be caused by shrink anisotropy of the coating in the curing process.

The hydrated metal compound (D1) used in the first embodiment is particularly preferably surface-treated with a surface treating agent having a polarity in view of an improvement in transparency. Examples of the surface treating agent having a polarity include silane coupling agent such as epoxysilane, aminosilane, vinylsilane, or mercaptosilane, and titanate coupling agent.

(ii) Brominated Epoxy Compound (D2)

Examples of the brominated epoxy compound (D2) include compounds represented by the following formulas (I) to (III). In the formulas (II) to (III), Y is a hydrogen atom or a group represented by the formula (IV), and Z is a group represented by the formula (IV). p is an integer of 0 or 1 or more, and preferably from 1 to 20, and q is an integer of 0 or 1 or more, and preferably from 1 to 10, (I)

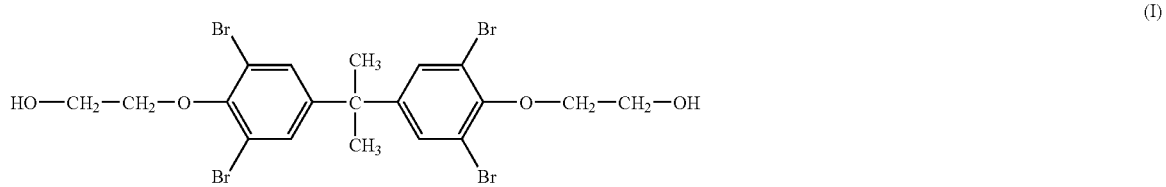

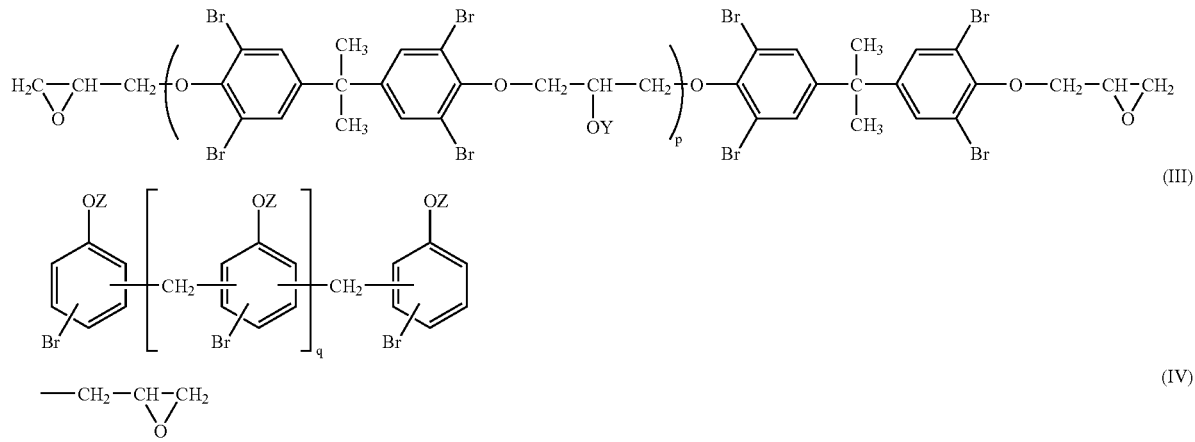

Also an acid-modified brominated epoxy resin obtained by reacting the reaction product of the above-described brominated epoxy compound and the unsaturated group-containing monocarboxylic acid with a saturated or unsaturated group-containing polybasic anhydride can be used. Examples of the unsaturated group-containing monocarboxylic acid include acrylic acid, dimer of acrylic acid, methacrylic acid, β-furfurylacrylic acid, β-styrylacrylic acid, cinnamic acid, crotonic acid, and α-cyanocinnamic acid. Examples of the saturated or unsaturated group-containing polybasic anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride.

Among these brominated epoxy resins, a particularly preferred brominated epoxy compound is a tetrabromobisphenol A type epoxy resin having an epoxy equivalent of 200 to 3000 and a bromine content of 40 to 60% by weight. When the epoxy equivalent is less than 200, satifactory pliability cannot be obtained. On the other hand, when the epoxy equivalent exceeds 3000, the developability is likely to be lowered and the availability becomes poor. When the bromine content is less than 50% by weight, satisfactory flame resistance cannot be obtained. On the other hand, when the bromine content exceeds 60% by weight, the availability becomes poor, sometimes.

As the brominated epoxy compound (D2) as the first embodiment, a brominated epoxy (meth)acrylate compound obtained by reacting the above-described brominated epoxy compound with the unsaturated group-containing monocarboxylic acid can also be used. As the brominated epoxy (meth)acrylate compound, for example, tetrabromobisphenol A type epoxy (meth)acrylate, tetrabromobisphenol F type epoxy (meth)acrylate and tetrabromobisphenol S type epoxy (meth)acrylate are preferred because of excellent pliability. The bromine content of this brominated epoxy (meth)acrylate compound is preferably within a range from 30 to 60% by weight. When the bromine content is less than 30% by weight, satisfactory flame resistance cannot be obtained. On the other hand, when the bromine content exceeds 60% by weight, the availability becomes poor, sometimes.

Furthermore, an acid-modified brominated epoxy (meth)acrylate compound obtained by reacting the above-described brominated epoxy (meth)acrylate compound with the saturated or unsaturated group-containing polybasic anhydride can also be used.

(iii) Phosphate Ester Compound (D3)

In the first embodiment, as the flame-retarding agent, a phosphate ester compound (D3) can be further included, in addition to the above-described hydrated metal compound (D1) and the brominated epoxy compound (D2). When the pliability is poor, the pliability can be enhanced by using in combination with the phosphate ester compound without impairing the flame resistance. Therefore, it is preferred. It becomes possible to realize balance between the flame resistance and the pliability to a high level by forming a composite flame retardant system composed of three components D1, D2, and D3.

The phosphate ester compound (D3) used optionally in the first embodiment refers to a compound having a bond of a chemical structure represented by the formula: "P—O—R" (R is an organic group) and those having trivalent or pentavalent phosphorus atoms are commonly used. Examples of the compound having trivalent phosphorous atoms include phosphite compound, phosphonite compound, and phosphinite compound. Examples of the compound having pentavalent phosphorous atoms include phosphate compound, phosphonate compound, and phosphinate compound. Among these compounds, a phosphate ester compound having pentavalent phosphorous atoms is preferably used in view of the storage stability.

The organic group, which forms an ester of these phosphate ester compounds, may be any of an aliphatic hydrocarbon group, an aromatic hydrocarbon group, and an alicyclic hydrocarbon group. Those having aromatic hydrocarbon groups, among these organic groups, are preferred in view of the flame resistance and soldering heat resistance.

As the phosphate ester compound, pentavalent compounds having aromatic hydrocarbon groups are particularly preferred and examples thereof include triphenyl phosphate, resorcinol bis(diphenyl) phosphate, 2-ethylhexyldiphenyl phosphate, and those containing a skeleton represented by the following formula (V) (in the formula (V), X(s) may be the same or different and represent a mono- or polyvalent aromatic group).

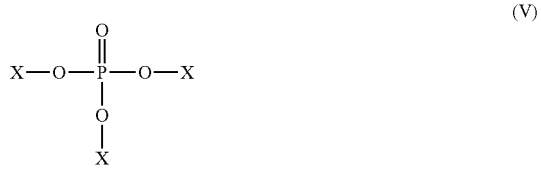

Among these phosphate ester compounds, those containing a skeleton represented by the above formula (V) are preferred, and specific examples thereof include compounds represented by the following formulas (VI) and (VII).

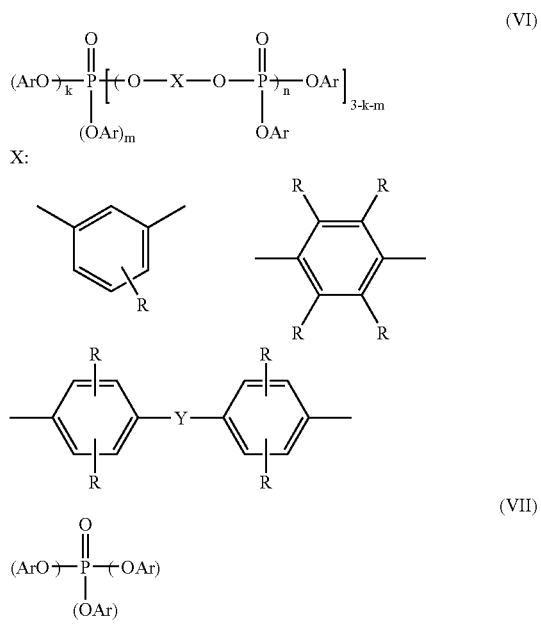

In the formula (VI), R(s) may be the same or different and represent a hydrogen atom or an alkyl group having 1 to 5 carbon atoms. Y represents a direct bond, an alkylene group, a phenylene group, —S—, —SO$_2$—, or —CO—. Ar(s) may be the same or different and represent an aromatic group, or an aromatic group substituted with an organic group. k and m each represents an integer of 0 or more and 2 or less, k+m is an integer of 0 or more and 2 or less, and n is an integer of 0 or more.

The molecular weight of the phosphate ester compound (D3) is 300 or more, preferably 350 or more, and more preferably 500 or more. It is more preferred in view of the moisture resistance and the soldering heat resistance that the phosphate ester compound having a molecular weight of 300 or more account for 50% by weight or more of the entire phosphate ester compound. In the composition as the first embodiment, the same effect can be obtained by incorporating a phosphate ester having trivalent phosphorus atoms into the composition and converting it into a phosphate ester having pentavalent phosphorus atoms by means of oxidation in the composition.

(iv) Amount of Flame-retarding Agent

The amount of D1, D2, and D3, which is optionally used, in the flame-retarding agent used in the first embodiment is not specifically limited. In the case of the resist curable resin material (photocurable resin material), the amount of D1 is preferably within a range from 10 to 100 parts by weight, the amount of D2 is preferably within a range from 10 to 80 parts by weight, and the amount of D3 is preferably within a range from 0.5 to 40 parts by weight, when optionally used, based on 100 parts by weight of the total weight of the components (A-1), (B) and (C). More preferably, the amount of D1 is within a range from 20 to 80 parts by weight, the amount of D2 is within a range from 20 to 60 parts by weight, and the amount of D3 is preferably within a range from 1 to 30 parts by weight, when optionally used. Particularly preferably, the amount of D1 is within a range from 30 to 60 parts by weight, the amount of D2 is within a range from 30 to 50 parts by weight, and the amount of D3 is preferably within a range from 5 to 20 parts by weight, when optionally used.

Based on the amount described above, the amount of D1 to D3 based on the total amount of the flame-retarding agent and the resist curable resin composition is shown below.

The amount of the hydrated metal compound (D1) is not specifically limited, but is preferably within a range from 11 to 91% by weight, more preferably from 25 to 80% by weight, and particularly preferably from 38 to 67% by weight, based on the total amount of the flame-retarding agent when the flame-retarding agent (D) is composed of the hydrated metal compound (D1) and the brominated epoxy compound (D2). Also the amount of the hydrated metal compound (D1) relative to the total amount of the resist curable resin composition as the first embodiment is not specifically limited, but is preferably within a range from 5 to 48% by weight, more preferably from 11 to 40% by weight, and particularly preferably from 16 to 32% by weight.

When the flame-retarding agent is composed of the hydrated metal compound (D1), the brominated epoxy compound (D2) and the phosphate ester compound (D3), the amount of the hydrated metal compound (D1) is preferably within a range from 7 to 90% by weight, more preferably from 18 to 79% by weight, and particularly preferably from 30 to 63% by weight, based on the total amount of the flame-retarding agent. Also the amount is preferably within a range from 4 to 47% by weight, more preferably from 9 to 40% by weight, and particularly preferably from 15 to 31% by weight, based on the total amount of the resist curable resin composition as the first embodiment.

When the amount of the hydrated metal compound is too small, the flame resistance is poor. As a result, the amount of the brominated epoxy compound and/or the phosphate ester compound must be increase, thereby lowering the acid value and the developability. On the other hand, when the amount is too large, the cured film is liable to become opaque and the flexibility is lowered, thereby causing poor pliability. Also warp occurs sometimes.

The amount of the brominated epoxy compound (D2) is not specifically limited, but is preferably within a range from 9 to 89% by weight, more preferably from 20 to 75% by weight, and particularly preferably from 33 to 63% by weight, based on the total amount of the flame-retarding agent when the flame-retarding agent is composed of the hydrated metal compound (D1) and the brominated epoxy compound (D2). Also the brominated epoxy compound (D2) relative to the total amount of the resist curable resin composition as the first embodiment is not specifically limited, but is preferably within a range from 5 to 42% by weight, more preferably from 10 to 33% by weight, and particularly preferably from 15 to 28% by weight.

When the flame-retarding agent is composed of the hydrated metal compound (D1), the brominated epoxy compound (D2) and the phosphate ester compound (D3), the amount of the brominated epoxy compound (D2) is preferably within a range from 6 to 88% by weight, more preferably from 15 to 74% by weight, and particularly preferably from 27 to 59% by weight, based on the total amount of the flame-retarding agent. Also the amount is preferably within a range from 4 to 42% by weight, preferably from 9 to 33% by weight, and particularly preferably from 14 to 27% by weight, based on the total amount of the resist curable resin composition as the first embodiment. When the amount of the brominated epoxy compound is too small, the flame-retarding effect is sometimes poor. On the other hand, when the amount is too large, the pliability and the developability are sometimes lowered.

When using the phosphate ester compound (D3), the amount is not specifically limited, but is preferably within a range from 0.2 to 67% by weight, more preferably from 0.7 to 43% by weight, and particularly preferably from 4 to 25% by weight, based on the total amount of the flame-retarding agent. Also the amount of the phosphate ester compound relative to the total amount of the resist curable resin composition as the first embodiment is not specifically limited, but is preferably within a range from 0.1 to 25% by weight, preferably from 0.4 to 18% by weight, and particularly preferably from 2 to 12% by weight. When the amount of the phosphate ester compound (D3) is too small, the pliability is sometimes poor. On the other hand, when the amount is too large, the appearance of the coating film is impaired by bleedout.

The total amount of the flame-retarding agent in the resist curable resin composition as the first embodiment is preferably within a range from 17 to 69% by weight, more preferably from 29 to 63% by weight, and particularly preferably from 39 to 57% by weight. When the amount of the flame-retarding agent is too small, the flame resistance is poor. On the other hand, when the amount is too large, the transparency, pliability, strength (folding resistance) and developability are sometimes lowered.

III-1. Other Components (i) Thermocurable Resin (E)

In the first embodiment, when the resist curable resin material is a photocurable resin material, an electron beam curable resin material, or an X-ray curable resin material, the resist curable resin composition can optionally contain a thermocurable resin (E) as a thermocuring component. Such a thermocurable resin (E) may be a resin which is self-cured by heat, or a resin which reacts with carboxyl group of the photosensitive prepolymer by heat. Such a thermocurable resin (E) can be selected from the same resin materials as those used in the thermocurable resin material described above. These thermocurable resins can be used alone, or two or more kinds of them can be used in combination. Among these thermocurable resins, an epoxy resin is preferred. Specific examples of the epoxy resin can also be selected from those used in the thermocurable resin material described above.

The resist curable resin composition as the first embodiment is preferably a nonuniform system containing a phase made of the epoxy resin. Specifically, it is in the state where a solid or semi-solid epoxy resin is recognized in the resist curable resin composition before curing and the epoxy resin is mixed nonuniformly in the resist curable resin composition. The particle diameter is preferably a particle diameter which exerts an adverse influence on the screen printing and production of the dry film. For example, there is also included the state where the entire resist curable resin composition before curing is not uniformly transparent and at least a portion of the composition is opaque. It is preferred that the resist curable resin composition before curing is be a nonuniform system containing a phase made of the epoxy resin, as described above, because the shelf life of the resist curable resin composition is prolonged.

Examples of preferred epoxy resin used for these purposes include bisphenol S type epoxy resin, diglycidyl phthalate resin, heterocyclic epoxy resin, bixylenol type epoxy resin, biphenyl type epoxy resin, and tetraglycidyl xylenoylethane resin. More preferably, the resist curable resin composition contains a phase made of the epoxy resin and the resist curable resin composition before curing is a nonuniform system. As the epoxy resin wherein the resist curable resin composition before curing is a nonuniform system, a biphenyl type epoxy resin is more preferred because it is a crystal having a clear melting point and easily forms a nonuniform composition and can produce a cured article having high heat resistance.

In the resist curable resin composition as the first embodiment, when using in combination with the thermocurable resin (E), the amount is preferably within a range from 10 to 150 parts by weight, and more preferably from 10 to 50 parts by weight, based on 100 parts by weight of the total weight of the curing component (the photosensitive prepolymer (A-1) and the compound having an ethylenically unsaturated group (B)) when using the photocurable resin material.

When the amount of thermocurable resin (E) is less than 10 parts by weight, the soldering heat resistance of the cured film becomes unsatisfactory, sometimes. On the other hand, when the amount exceeds 150 parts by weight, the shrink amount of the cured film increases. Therefore, when using the cured film as an insulating protective film of a FPC board, warp (curl) tends to increase.

(ii) Thermal Polymerization Catalyst (F)

In the first embodiment, when using the photocurable resin material (or electron beam curable resin material or X-ray curable resin material) in combination with the thermocurable resin (E), a thermal polymerization catalyst (F) having an action of thermocuring the thermocurable resin (E) can be optionally used. Specifically, there can be used amines; amine salts or quaternary ammonium salts such as chloride of amines; acid anhydrides such as cyclic aliphatic acid anhydride, aliphatic acid anhydride, and aromatic acid anhydride; polyamides; imidazoles; nitrogen-containing heterocyclic compounds such as triazine compound; and organometallic compounds. These thermal polymerization catalysts can be used alone, or two or more kinds of them can be used in combination.

Examples of amines include aliphatic and aromatic primary, secondary, and tertiary amines. Examples of the aliphatic amine include polymethylenediamine, polyetherdiamine, diethylenetriamine, triethylenetriamine, tetraethylenepentamine, triethylenetetramine, dimethylaminopropylamine, menthenediamine, aminoethylethanolamine, bis(hexamethylene)triamine, 1,3,6-trisaminomethylhexane, tributylamine, 1,4-diazabicyclo[2,2,2]octane, and 1,8-diazabicyclo[5,4,0]undecen-7-ene. Examples of the aromatic amine include methaphenylenediamine, diaminodiphenylmethane, diaminodiphenylmethane, and diaminodiphenylsulfone.

Examples of acid anhydrides include aromatic acid anhydride such as phthalic anhydride, trimellitic anhydride, benzophenonetetracarboxylic ahhydride, ethylene glycol bis (anhydro trimellitate), or glycerol tris(anhydro trimellitate), maleic anhydride, succinic anhydride, methylnadic anhydride, hexahydrophthalic anhydride, tetrahydrophthalic anhydride, polyadipic anhydride, chlorendic anhydride, and tetrabromophthalic anhydride.

Examples of polyamides include polyaminoamide having first and second amino groups obtained by reacting dimer acid with polyamine such as diethylenetriamine or triethylenetetramine.

Specific examples of the imidazoles include imidazole, 2-ethyl-4-methylimidazole, N-benzyl-2-methylimidazole, 1-cyanoethyl-2-undecylimidazolium trimellitate, and 2-methylimidazolium isocyanurate.

The triazine compound is a compound having a six-membered ring containing three nitrogen atoms, and examples thereof include melamine compound, cyanuric acid compound, and cyanuric acid melamine compound. Specific examples of the melamine compound include melamine, N-ethylenemelamine, and N,N',N"-triphenylmelamine. Examples of the cyanuric acid compound include cyanuric acid, isocyanuric acid, trimethyl cyanurate, trismethyl isocyanurate, triethyl cyanurate, trisethyl isocyanurate, tri(n-propyl) cyanurate, tris(n-propyl) isocyanurate, diethyl cyanurate, N,N'-diethyl isocyanurate, methyl cyanurate, and methyl isocyanurate. Examples of the cyanuric acid melamine compound include an equimolar reaction product of a melamine compound and a cyanuric acid compound.

Examples of the organometallic compound include organic acid metal salt, 1,3-diketone metal complex salt, and metal alkoxide. Specific examples thereof include organic acid metal salt such as dibutyltin dilaurate, dibutyltin maleate, or zinc 2-ethylhexanoate; 1,3-diketone metal complex salt such as nickel acetylacetonate or zinc acetylacetonate; and metal alkoxide such as titanium tetrabutoxide, zirconium tetrabutoxide, or aluminum butoxide.

The amount of the thermal polymerization catalyst (F) is preferably within a range from 0.5 to 20 parts by weight, and more preferably from 1 to 10 parts by weight, based on 100 parts by weight of the thermocurable resin (E). When the amount of the thermal polymerization catalyst (F) is less than 0.5 parts by weight, the curing reaction does not proceed satisfactorily and the heat resistance is lowered. Since curing at high temperature for a long time is required, the operation efficiency is sometimes lowered. On the other hand, when the amount is more than 20 parts by weight, the catalyst reacts with carboxyl groups in the resist curable resin composition and gelation is liable to occur, thus causing a problem such as lowering of the storage stability.

(iii) Others

If necessary, organic solvents may be added to the resist curable resin composition to control the viscosity. Control of the viscosity makes it easy to apply or print on the objective article using a roller coating, spin coating, screen coating, curtain coating, knife coating or blade coating method.

Examples of the organic solvent include ketone solvent such as ethyl methyl ketone, methyl isobutyl ketone, or cyclohexanone; ester solvent such as ethyl acetoacetate, y-butyrolactone, or butyl acetate; alcohol solvent such as butanol or benzyl alcohol; cellosolve solvent, carbitol solvent, or ester or ether derivative thereof, such as carbitol acetate or methyl cellosolve acetate; amide solvent such as N,N-dimethylformamide, N,N-dimethylacetamide, or N-methyl-2-pyrrolidone; dimethyl sulfoxide; phenol solvent such as phenol or cresol; nitro compound solvent; toluene, xylene, hexamethylbenzene, and cumene aromatic solvent; and aromatic and alicyclic solvent made of hydrocarbon such as tetralin, decalin, or dipentene. These organic solvents can be used alone, or two or more kinds of them can be used in combination.

The amount of the organic solvent is preferably controlled so that the viscosity of the resist curable resin composition is set within a range from 500 to 500,000 mPa·s [as measured at 25° C. using a B type viscometer (Brookfield Viscometer)]. More preferably, the viscosity is within a range from 1,000 to 500,000 mPa·s. Such a viscosity is suited for coating or printing onto the objective article, resulting in good handling. The amount of the organic solvent suited to achieve such a viscosity is 1.5 times by weight, as much as the solid content other than the organic solvent. When the amount exceeds 1.5 times by weight, the solid content is reduced and, when printing this resist curable resin composition on the substrate, satisfactory film thickness cannot be obtained by a single printing operation and printing must be conducted several times.

Such a resist curable resin composition can also be used as ink by further adding colorants. Examples of the colorant include phthalocyanine blue, phthalocyanine green, iodine green, disazo yellow, crystal violet, titanium oxide, carbon black, and naphthalene black. When used as the ink, the viscosity is preferably within a range from 500 to 500,000 mPa·s [as measured at 25° C. using a B type viscometer (Brookfield Viscometer)].

To the resist curable resin composition as the first embodiment, flow modifiers can be added to control the fluidity. The flow modifier is preferred because it can appropriately control the fluidity of the resist curable resin composition when the resist curable resin composition is applied onto the objective article using a roller coating, spin coating, screen coating, curtain coating, knife coating or blade coating method. Examples of the flow modifier include inorganic and organic fillers, waxes, and surfactants.

Specific examples of the inorganic filler include talc, barium sulfate, barium titanate, silica, alumina, clay, magnesium carbonate, calcium carbonate, aluminum hydroxide, and silicate compound. Specific examples of the organic filler include silicone resin, silicone rubber, and fluororesin. Specific examples of the wax include polyamide wax and polyethylene oxide wax. Specific examples of the surfactant include silicone oil, higher fatty acid ester, and amide. These flow modifiers can be used alone, or two or more kinds of them can be used in combination. Among these flow modifiers, the inorganic filler is preferably used because not only the fluidity but also properties such as adhesion and hardness of the resist curable resin composition can be improved.

If necessary, additives such as thermal polymerization inhibitors, thickeners, defoamers, leveling agents, and adhesion imparting agent can be added to the resist curable resin composition.

Examples of the thermal polymerization inhibitor include hydroquinone, hydroquinone monomethyl ether, tert-butyl catechol, pyrogallol, and phenothiazine.

Examples of the thickener include layered silicates such as hectorite, montmorillonite, saponite, beidellite, stivensite, mica terasilicate, or teniolite, and interlaminar compound obtained by treating the layered silicate with organic cations, silica, and organized silica.

The defoamer is used to remove bubbles formed during printing, coating and curing, and specific examples thereof include acrylic- and silicon-based surfactants.

The leveling agent is used to remove the unevenness of the surface of the coating film formed during the printing and coating, and specific examples thereof include acrylic- and silicon-based surfactants.

Examples of the adhesion imparting agent include imidazole-based, thiazole-based, triazole-based and silane coupling agents.

As other additives, ultraviolet inhibitors and plasticizers can be added to secure the storage stability as long as the object of this embodiment is not impaired.

The resist curable resin composition as the second embodiment of the present invention will be described below. The resist curable resin composition as the second embodiment comprises a resist curable resin material and a hydrated metal compound. With respect to the same constitution as in the first embodiment, description is omitted.

I-2. Resist Curable Resin Composition (i) Photocurable Resin Material (1) Photosensitive Prepolymer (A-2)

<Urethane (Meth)Acrylate Compound Having a Carboxyl Group (UA)>

When using a urethane (meth)acrylate compounds (a) and a urethane (meth)acrylate compound (b), which differ in acid value, in combination, a weight ratio of the urethane (meth)acrylate compound (a) to the urethane (meth)acrylate compound (b) is preferably 40–90:60–10, and preferably 50–80:50–20, in the total amount (100 parts by weight) of the urethane (meth)acrylate compound having a carboxyl group.

Others are the same as in the first embodiment.

(2) Compound Having an Ethylenically Unsaturated Group (B)

Compound (B) of the second embodiment is the same as the compound having an ethylenically unsaturated group (B) of the first embodiment.

(3) Photopolymerization Initiator (C)

Photopolymerization initiator (C) of the second embodiment is the same as the photopolymerization initiator (C) of the first embodiment.

(ii) Electron Beam Curable Resin Material

Electron beam curable resin materials of the second embodiment are the same as the the electron beam curable resin materials of the first embodiment.

(iii) X-Ray Curable Resin Material

X-ray curable resin materials of the second embodiment are the same as the X-ray curable resin materials of the first embodiment.

(iv) Thermocurable Resin Material

Thermocurable resin materials of the second embodiment are the same as the thermocurable resin materials of the first embodiment.

II-2. Surface-Treated Hydrated Metal Compound

In the second embodiment, a surface-treated hydrated metal compound is incorporated into the resist curable resin material described above.

(i) Hydrated Metal Compound

The hydrated metal compound used in the second embodiment is a metal compound containing water of crystallization and includes, but is not limited to, those causing endothermy upon thermolysis of 400 J/g or higher.

Specific examples of the hydrated metal compound are the same as those described in the first embodiment.

As the hydrated metal compound, a hydrotalcite-based compound, which has a layered crystal structure and also has hydrated anions between crystal layers, or a hydrotalcite-based compound, which has a layered crystal structure and also has organic anions between crystal layers is preferably used. Hydrotalcites as the second embodiment are represented by the following general formulas (c) and (d):

 (c)

 (d)

wherein $0.1 \leq x \leq 0.4$, $0<y<2$, $M^{1+}$ is at least one kind of a monovalent metal such as Li, Na, K, Rb, or Cs, $M^{2+}$ is at least one kind of a divalent metal such as Mg, Ca, Mn, Fe, Co, Ni, Cu, or Zn, $M^{3+}$ is at least one kind of a trivalent metal such as Al, Fe, Cr, or In, and each $[anion]^{x-}$ and $[anion]^{y-}$ is a hydrated anion or an organic anion, which exists between crystal layers.

Similarly to the first embodiment, the compound of the general formula (c) wherein $M^{2+}$ is $Mg^{2+}$ and $M^{3+}$ is $Al^{3+}$ is referred to as hydrotalcite, while compounds of the formulas (c) and (d), except the above-mentioned hydrotalcite, are commonly referred to as hydrotalcite-like compounds.

In the case of the hydrotalcite-based compound having hydrated anions between the crystal layers, $[anion]^{x-}$ and $[anion]^{y-}$ are converted into a hydrated anion represented by $[A^{n-}_{x/n}.mH_2O]^{x-}$ and $[A^{n-}_{x/n}.mH_2O]^{y-}$ respectively in the above general formulas (c) and (d). Therefore, the hydrotalcite-based compounds having hydrated anions between the crystal layers are represented by the following general formulas (e) and (f). In the formulas, $A^{n-}$ is at least one kind of an ion-exchanging anion having a valence of n, such as $Cl^-$, $Br^-$, $CO_3^{2-}$, $NO_3^{2-}$, $SO_4^{2-}$, $Fe(CN)_6^{4-}$, and tartaric acid ion.

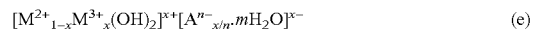 (e)

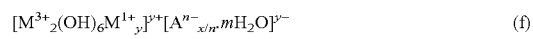 (f)

In the formulas, $0.1 \leq x \leq 0.4$, $0<y<2$, m is an integer of 1 or more, and n is an integer of from 1 to 4. $M^{1+}$, $M^{2+}$, and $M^{3+}$ are as defined in the formulas (c) and (d).

In the case of the hydrotalcite-based compound having organic anions between the crystal layers, the organic anions are not specifically limited, but are preferably amino acids, sulfur-containing compounds, nitrogen-containing heterocyclic compounds, and salt compounds thereof.

Specific examples thereof include amino acid derivatives such as leucine, cysteine, phenylalanine, tyrosine, aspartic acid, glutaminic acid, lysine, 6-aminohexylcarboxylic acid, 12-aminolaurylcarboxylic acid, N,N-dimethyl-6-aminohexylcarboxylic acid, N-n-dodecyl-N,N-dimethyl-10-aminodecylcarboxylic acid, or dimethyl-N-12-aminolaurylcarboxylic acid; sulfur-containing compounds and salt compounds thereof, such as 2-chlorobenzothiazole, thioacetic acid, methyldithiocarbamic acid, or dimethyldithianocarbamic acid; and nitrogen-containing heterocyclic compounds and salt compounds thereof, such as 2-mercaptothiazoline, 2,5-dimercapto-1,3,4-thiadiazole, 1-carboxymethyl-5-mercapto-1H-tetrazole, or 2,4,6-trimercapto-s-triazine.

The hydrotalcite-based compound having organic anions between the crystal layers does not exist in nature and can be obtained by treating the hydrotalcite-based compound with an organic solvent containing predetermined organic anions.

The particle size of the surface-treated hydrated metal compound used in the second embodiment is not specifically limited, but the average particle diameter is preferably within a range from 0.05 to 40 µm, and more preferably from 0.1 to 2.0 μm. When the average particle diameter exceeds 30 μm, the transparency of the cured film becomes poor, and therefore, the light transmittance is lowered and the appearance and the smoothness of the surface of the coating film are impaired, sometimes. When the average particle diameter is less than 0.05 μm, there is such a drawback that the productivity of the powder is drastically lowered.

When using the hydrotalcite-based compound, the particle size, that is, the average particle diameter is within a range from 0.05 to 10 μm, and more preferably from 0.1 to 5.0 μm. When the average particle diameter exceeds 10 μm, the light transmittance of the cured film is lowered and warp is likely to be caused by shrink anisotropy of the coating in the curing process. On the other hand, when the average particle diameter is less than 0.05 μm, there is a drawback in that the productivity of the powder is drastically lowered.

The particle diameter of the surface-treated hydrated metal compound as the second embodiment can be determined by the sedimentation type particle size measuring method in a solvent or the light scattering method. Alternatively, the particle diameter may be determined from a frequency distribution of each fraction based on the number as a reference, or accumulation distribution after directing observing particles using a transmission electron microscope or a scanning electron microscope and determining a geometrical diameter of individual particle. The value of the average particle diameter varies depending on the measuring method. The average particle diameter due to observation using the above microcope is a value obtained from logarithmic normal distribution after determining an average value of a major axis and a minor axis of an individual particle. In this embodiment, the value obtained by any method described above may be within a range of the above average particle diameter.

The hydrated metal compound used in the second embodiment is preferably a hydrated metal causing the endothermy upon thermolysis of 400 J/g or higher, and more preferably 600 to 2,500 J/g. When the endothermy is 400 J/g or higher, a high flame-retarding effect is obtained, sometimes.

(ii) Surface Treating Agent

A surface treating agent can be used in the surface treatment of the hydrated metal compound as the second embodiment. By mixing the surface-treated hydrated metal compound with the curable resin material, an increase in viscosity is suppressed, thereby to easily form a high concentration masterbatch intermediate material, and the transparency is noticeably improved. Since the dispersion state of the hydrated metal compound particles in the curable resin composition is improved, the pliability and the flame resistance are remarkably improved.

The surface treating agent is not specifically limited, but those having an amphipathic property and a polarity are preferred.

Specific examples of the surface treating agent having an amphipathic property include those selected from the group consisting of saturated and unsaturated fatty acids having 8 or more carbon atoms; primary amine, secondary amine, tertiary amine, and a chloride thereof; quaternary ammonium salt; amine compound; and amino acid derivative.

More specific examples thereof include primary amine such as octylamine, laurylamine, tetradecylamine, hexadecylamine, stearylamine, oleylamine, acrylamine, benzylamine, or aniline; secondary amine such as dilaurylamine, ditetradecylamine, dihexadecylamine, distearylamine, or N-methylaniline; tertiary amine such as dimethylocty- lamine, dimethyldecylamine, dimethyllaurylamine, dimethylmyristylamine, dimethylpalmitylamine, dimethylstearylamine, dilaurylmonomethylamine, tributylamine, trioctylamine, or N,N-dimethylaniline; and quaternary ammonium such as tetrabutyl ammonium ion, tetrahexyl ammonium ion, dihexyldimethyl ammonium ion, dioctyldimethyl ammonium ion, hexatrimethyl ammonium ion, octatrimethyl ammonium ion, dodecyltrimethyl ammonium ion, hexadecyltrimethyl ammonium ion, stearyltrimethyl ammonium ion, docosenyltrimethyl ammonium ion, cetyltrimethyl ammonium ion, cetyltriethyl ammonium ion, hexadecyl ammonium ion, tetradecyldimethylbenzyl ammonium ion, stearyldimethylbenzyl ammonium ion, dioleyldimethyl ammonium ion, N-methyldiethanol lauryl ammonium ion, dipropanolmonomethyl lauryl ammonium ion, dimethylmonoethanol lauryl ammonium ion, polyoxyetylenedodecylmonomethyl ammonium ion, or alkylaminopropylamine quaternized compound.

It further includes saturated fatty acid and metal salt thereof, such as caproic acid, lauric acid, myristic acid, palmitic acid, stearic acid, or arachic acid; unsaturated fatty acid and metal salt thereof, such as undecylenic acid, cetoleic acid, erucic acid, brassidic acid, sorbic acid, oleic acid, linoleic acid, or arachidonic acid; and amino acid derivatives such as leucine, phenylalanine, tyrosine, lysine, 12-aminolaurylcarboxylic acid, N-n-dodecyl-N,N-dimethyl-10-aminodecylcarboxylic acid, or dimethyl-N-12-aminolaurylcarboxylic acid.

Specific examples of the surface treating agent having a polarity include those selected from the group consisting of titanate coupling agent, aluminum coupling agent, zircoaluminate coupling agent, and silane coupling agent.

Examples of the silane coupling agent include 3-chloropropyltrimethoxysilane, vinyltrichlorosilane, vinyltriethoxysilane, vinyltrimethoxysilane, vinyl tris(2-methoxyethoxy) silane, 3-methacryloxypropyltrimethoxysilane, 2-(3,4-epoxycyclohexyl)ethyltrimethoxysilane, 3-glycidoxypropyltrimethoxysilane, 3-mercaptopropyltrimethoxysilane, 3-aminopropyltriethoxysilane, N-2-(aminoethyl)-3-aminopropyltrimethoxysilane, and 3-ureidopropyltriethoxysilane.

Examples of the titanate coupling agent include isopropyltriisostearoyl titanate, isopropyltridodecylbenzenesulfonyl titanate, isopropyltris(dioctylpyrophosphate) titanate, tetraisopropylbis(dioctylphosphite) titanate, tetraoctylbis(ditridecylphosphite) titanate, tetra(2,2-diallyloxymethyl-1-butyl)bis(di-tridecyl)phosphite titanate, bis (dioctylpyrophosphate)oxyacetate titanate, bis(dioctylpyrophosphate)ethylene titanate, isopropyltrioctanoyl titanate, isopropyldimethacrylisostearoyl titanate, isopropylisostearoyldiacryl titanate, isopropyltri(dioctylphosphate) titanate, isopropylcumylphenyl titanate, isopropyltri(N-amidoethyl-aminoethyl) titanate, dicumylphenyloxyacetate titanate, and diisostearoylethylene titanate.

Examples of the aluminum coupling agent include acetoalkoxy aluminum diisopropylate.

Examples of the zircoaluminate coupling agent include compounds having a skeleton represented by the following general formula. In the functional group (—RX), R represents an optionally substituted alkylene group, and X represents an amino group, a carboxyl group, a mercapto group, an alkyl group or an alkenyl group. RX— includes the group of the following organic groups. These compounds may have one or two or more kinds of these functional groups.

Group of organic groups; —(CH$_2$)$_2$NH$_2$, —(CH$_2$)$_4$COOH, —(CH$_2$)$_{12}$CH$_3$, —C(CH$_3$)═CH$_2$, —(CH$_2$)$_2$SH, —(CH$_2$)$_2$NH$_2$

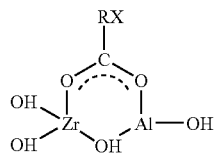

The amount of the surface treating agent is preferably within a range from about 0.1 to 5.0% by weight, and more preferably from about 0.4 to 2.0% by weight, based on the amount of the hydrated metal compound. When the amount of the surface treating agent is too small, the formability is sometimes poor because an increase in viscosity is likely to occur when formed into a film-like article such as cured film. On the other hand, when the amount of the surface treating agent is too large, the heat resistance is lowered by an increase in unreacted product and outgassing occurs in the heating step.

When using the hydrotalcite-based compound having organic anions during the crystal layers, it is surface-treated after treating with a solvent containing organic anions. Since the hydrotalcite-based compound having organic anions during the crystal layers itself is an already surface-treated substance, it is not necessary to surface-treat with the above surface treating agent and the compound can be used as it is as a "hydrated metal compound surface-treated with the surface treating agent" as the second embodiment.

(iii) Amount

The surface-treated hydrated metal compound as the second embodiment is preferably incorporated in the amount within a range from 10 to 100 parts by weight, more preferably from 20 to 80 parts by weight, and particularly preferably from 30 to 60 parts by weight, based on 100 parts by weight of the resist curable resin material.

When the amount of the hydrated metal compound is too small, the flame resistance is poor and, therefore, the amount of the other flame-retarding components such as brominated epoxy compound and phosphate ester compound must be increased so as to obtain a high flame-retarding effect. Consequently, the acid value of the solid content and the developability are lowered. On the other hand, when the amount is too large, the resulting cured film is likely to become opaque and the flexibility is lowered, thereby lowering the pliability. Also, warping sometimes occurs.

III-2. Other Components

If necessary, various compounds can be incorporated into the resist curable resin composition of the present invention, in addition to the curable prepolymers and hydrated metal compounds described above. For example, the brominated epoxy compound and/or the phosphate ester compound can be incorporated as the flame-retarding component. An excellent flame-retarding effect is exerted by using in combination with the hydrated metal compound described above.

When the resist curable resin material is a photocurable resin material, an electron beam curable resin material or an X-ray curable resin material, the resist curable resin composition can optionally contain a thermocurable resin, as a thermocuring component, together with a thermal polymerization catalyst.

(i) Brominated Epoxy Compound

The amount of the brominated epoxy compound to be incorporated into the resist curable resin composition is not specifically limited, but is preferably within a range from 10 to 80 parts by weight, more preferably from 20 to 60 parts by weight, and particularly preferably from 30 to 50 parts by weight, based on 100 parts by weight the resist curable resin composition. When the amount of the brominated epoxy compound is too small, the flame-retarding effect is sometimes poor. On the other hand, when the amount is too large, the pliability and developability are sometimes lowered.

Others are the same as in the first embodiment.

(ii) Phosphate Ester Compound

If necessary, a phosphate ester compound can be incorporated. Consequently, the flame resistance of the curable resin composition can be enhanced. When the pliability is poor, the pliability can be enhanced by using the hydrated metal compound, the brominated epoxy compound, and the phosphate ester compound in combination without impairing the flame resistance. Therefore, it is preferred. It becomes possible to realize balance between the flame resistance and the pliability to a high level by forming a composite flame retardant system composed of three components of the hydrated metal compound, the brominated epoxy compound, and the phosphate ester compound.

These phosphate ester compounds may be used alone, or several kinds of them may be used in combination.

The amount of the phosphate ester compound is not specifically limited, but is preferably within a range from 0.5 to 40 parts by weight, more preferably from 1 to 30 parts by weight, and particularly from 5 to 20 parts by weight, based on 100 parts by weight of the resist curable resin composition. When the amount of the phosphate ester compound is too small, the pliability is sometimes poor. On the other hand, when the amount is too large, the appearance of the coating film is sometimes impaired by bleedout.

Others are as the same as in the first embodiment.

(iii) Thermocurable Resin (E)

Thermocurable resin (E) of the second embodiment is the same as the thermocurable resin (E) of the first embodiment.

(iv) Thermal Polymerization Catalyst (F)

Thermal polymerization catalyst (F) of the second embodiment is the same as the thermal polymerization catalyst (F) of the first embodiment.

(v) Others

Others are the same as in the first embodiment.

The method for preparing a resist curable resin composition will be described below.

The resist curable resin compositions as the first and second embodiments of the present invention can be prepared by mixing the above respective components using a conventional method. The mixing method is not specifically limited and the remaining components may be mixed after mixing a portion of component, or all components may be mixed at a time.

Specifically, the above respective components are preferably mixed and are subsequently melt-kneaded. For example, the resist curable resin composition is prepared by melt-kneading using a known kneading means such as a Banbury mixer, kneader, roller, single-screw extruder, twin-screw extruder, or co-kneader. The melt temperature is preferably within a range from 60 to 130° C. A resist curable resin composition, wherein the viscosity at room temperature is reduced to that of ink by diluting with a solvent, can be prepared by a known kneading means such as a three roll mill or a beads mill.

The cured resin and use of the resist curable resin composition will be described below.

The resist curable resin compositions as the first and second embodiments of the present invention can be converted into a cured article by applying on a substrate in a proper thickness, heat-treating and drying the coating film, following by exposure, development, and further thermocuring.

The resist curable resin composition of the present invention can be used for various purposes, and is in particularly suited for use as an insulating protective coating film of a print circuit board because it is superior in photosensitivity and developability and is also superior in adhesion to the substrate, insulating properties, heat resistance, warp resistance, pliability and appearance when cured to form a thin film.

The insualting protective coating film is formed by applying a resist curable resin composition or ink on a substrate with a circuit formed by a conductor in a thickness of 10 to 100 μm, drying while heat-treating at a temperature within a range from 60 to 100° C. for about 5 to 30 minutes, thereby reducing to the thickness to 5 to 70 μm, exposing to light through a nagative mask with a desired exposure pattern, developing while removing the non-exposure portion with a developing solution, and thermocuring at a temperature within a range from 100 to 180° C. for about 10 to 40 minutes. This resist curable resin composition is superior in flame resistance and is particularly superior in pliability and flexibility when converted into the cured article. Therefore, the resist curable resin composition is particularly suited for use as an insulating protective coating film of an FPC board, thus making it possible to produce an FPC board which is less likely to cause curling and is also superior in handling property.

For example, the resist curable resin composition may be used as an insulating resin layer between multi-layered print circuit boards.

Active light used in exposure may be active light emitted from a known active light source such as carbon arc, mercury vapor arc, or xenon arc. Since the sensitivity of the photopolymerization initiator (C) contained in the photosensitive layer is usually maximum in the ultraviolet range, the activating light source is preferably an activating light source which effectively emits ultraviolet light. As a matter of course, when the photopolymerization initiator (C) are sensitive to visible light, for example, 9,10-phenanthrenequinone, visible light may be used as activating rays. As the light source, a photographic photoflood lamp and a solar lamp are used, in addition to the active light sources described above.

As the developing solution, an aqueous alkali solution such as potassium hydroxide, sodium hydroxide, sodium carbonate, potassium carbonate, sodium phosphate, sodium silicate, ammonia, or amines can be used.

The resist curable resin composition can also be used as a photosensitive layer of a photosensitive dry film. The photosensitive dry film comprises a base made of a polymer film and a photosensitive layer made of the resist curable resin composition formed on the base. The thickness of the photosensitive layer is preferably within a range from 10 to 70 μm.

Examples of the polymer film used as the base include films made of a polyester resin such as polyethylene terephthalate or aliphatic polyester, or a polyolefin resin such as polypropylene or low-density polyethylene. Among these films, films made of polyester and low-density polyethylene are preferred. It is preferred that these polymer films be easily removable from the photosensitive layer because they must be removed from the photosensitive layer. The thickness of these polymer films is usually within a range from 5 to 100 μm, and preferably from 10 to 30 μm.

The photosensitive dry film can be produced by the photosensitive layer forming step of applying a resist curable resin composition on a base and drying the coating film. By forming a cover film on the photosensitive layer formed, there can be produced a photosensitive dry film wherein the base, the photosensitive layer, and the cover film are laminated in this sequence and the film is formed on both surfaces of the photosensitive layer. Since the cover film is peeled off when using the photosensitive dry film, the photosensitive layer can be protected by forming the cover film on the photosensitive layer before use, and thus the photosensitive film is superior in shelf life. As the cover film, the same polymer film as that used in the base can be used. The cover film and the base may be made of the same or different materials, and also have the same or different thicknesses.

To form an insulating protective film on the print circuit board using the photosensitive dry film, the laminating step of laminating the photosensitive layer of the photosensitive dry film with the substrate is first conducted. When using the photosensitive dry film provided with the cover film, the photosensitive layer is brought into contact with the substrate after exposing the photosensitive layer by peeling off the cover film. Then, the photosensitive layer and the substrate are thermally contact-bonded at about 40 to 120° C. by a pressure roller or the like, thereby laminating the photosensitive layer on the substrate.

Then, the exposure step of exposing the photosensitive layer to light through a negative mask provided with a desired exposure pattern, the step of peeling off the base from the photosensitive layer, the development step of developing by removing the non-exposure portion with a developing solution, and the thermocuring step of thermocuring the photosensitive layer are conducted, thereby making it possible to produce a printed circuit board wherein an insulating protective coating film is formed on the surface of the substrate.

Using such a photosensitive dry film, an insulating resin layer may be formed between multi-layered print circuit boards.

The active light and the developing solution used in the exposure may be the same as those described above.

The resist curable resin composition of the present invention has excellent film forming property and transparency and also has high flame resistance. When using a flame retardant, the resist curable resin composition can form a cured film, which has excellent flame resistance while maintaining a beautiful appearance and high pliability, and is also superior in photosensitivity and developability and meet performances such as heat resistance, electrical insulating properties and adhesion to the wiring board. This cured film is particularly superior in transparency, flame resistance, pliability, electrical insulating properties, and appearance. Therefore, it can form a good insulating protective film, which does not cause curling and is superior in electrical performances, handling property and pliability, even when used in a thin wiring board such as an FPC board.

EXAMPLES

The present invention will be described in detail by way of examples; however, the present invention is not limited to these examples.

Preparation Examples 1 to 3

Photosensitive prepolymers (A-1, A-2) having a carboxyl group were synthesized.

Preparation Example 1 <EA-1>

In a flask equipped with a gas introducing tube, a stirrer, a cooling tube and a thermometer, 291 g of a bisphenol A type epoxy compound manufactured by Asahi Ciba Co., Ltd. (trade name: "ARALDITE® #2600"), 129 g of bisphenol A and 0.20 g of triethylamine as a catalyst were charged and then reacted at 150 to 160° C. for one hour to obtain a bisphenol A type epoxy compound having a softening point of 97° C. and an epoxy equivalent of 1000 g/equiv. In the flask, 30 g of acrylic acid, 0.45 g of monomethyl ether hydroquinone as an inhibitor and 1.65 g of triphenylphosphine as an esterification catalyst were charged and then reacted at 120° C. for 5 hours to obtain a reaction product having an acid value of 1 mg KOH/g. In the flask, 168 g of tetrahydrophthalic anhydride was charged and then reacted at 120° C. until the acid value becomes 100 mg KOH/g. This reaction required 3 hours. In the flask, 265 g of ethylene glycol monomethyl ether acetate as a solvent and 114 g of "SUPER SOL #1800" manufactured by Mitsubishi Petroleum Co., Ltd. were charged to obtain an epoxy acrylate resin (EA-1).

Preparation Example 2 <UA-1>

In a reaction vessel equipped with a stirrer, a thermometer, and a condenser, 2550 g (3 mol) of polytetramethylene glycol (manufactured by HODOGAYA CHEMICAL CO., LTD, PTMG-850, molecular weight: 850), 670 g (5 mol) of dimethylolpropionic acid as a dihydroxyl compound having a carboxyl group, 1776 g (8 mol) of isophorone diisocyanate as a polyisocyanate, 238 g (2.05 mol) of 2-hydroxyethyl acrylate as a (meth)acrylate having a hydroxyl group, and each 1.0 g of p-methoxyphenol and di-t-butylhydroxytoluene were charged. Heating was stopped after heating to 60° C. while stirring, and 1.6 g of dibutyltin dilaurate was added. Upon the beginning of a decrease in the temperature of the reaction vessel, stirring was continued at 80° C. after heating. The reaction was completed after confirming by an infrared absorption spectrum that an absorption spectrum (2280 cm$^{-1}$) of an isocyanate groups disappeared. As a result, a carboxyl group-containing photosensitive prepolymer <UA-1>having a solid content of an acid value of 46 mg KOH/g and a solid content of 60% was obtained. The resulting prepolymer had a viscosity (25° C.) of 25,000 m·Pa.

Preparation Example 3 <UA-2>

In the same manner as in Preparation Example 1 <UA-1>, except that 800 g (1 mol) of polycarbonate diol (molecular weight: 800) containing a unit originating in hexamethylene carbonate and a unit originating in pentamethylene carbonate in a ratio of 1:1 was used as a polymer polyol, 938 g (7 mol) of dimethylolpropionic acid was used as a dihydroxyl compound having a carboxyl group, 1998 g (9 mol) of isophorone diisocyanate was used as a polyisocyanate, and 238 g (2.05 mol) of 2-hydroxyethyl acrylate was used as a (meth)acrylate having a hydroxyl group, respectively, a urethane acrylate was synthesized. The resulting urethane acrylate <UA-2> had a number-average molecular weight of 18,000 and an acid value of 90 mg KOH/g.

Then, a resist curable resin composition was prepared.

Examples 1 to 10 and Comparative Examples 1 to 4

According to the formulation (parts by weight) shown in Table 1, <EA-1>, <UA-1> and <UA-2> prepared in Preparation Examples 1 to 3 as a photosensitive prepolymer (A-1), a compound having an ethylenically unsaturated group (B), a photopolymerization initiator (C), a hydrated metal compound (D1), a brominated epoxy compound (D2), a phosphate ester compound (D3), a thermocurable resin (E), a thermal polymerization catalyst (F), and a solvent were mixed to prepare a curable resin composition. Although the solvent is used in the synthesis of the component (A-1) and the preparation of the composition, the amount of all components shown in Table 1 is expressed in terms of solid content after drying.

As the compound having an ethylenically unsaturated group (B), an epoxy acrylate: "RIPOXY SP-4010" (manufactured by SHOWA HIGHPOLYMER CO., LTD.) and a urethane acrylate: "EB1290K" (manufactured by DAICEL CHEMICAL INDUSTRIES, LTD) were used.

As the photopolymerization initiator (C), 2,4,6-trimethylbenzoylphenylphosphine oxide: "TPO" (manufactured by BASF Co.), 2-benzyl-2-dimethylamino-1-(4-morpholinophenyl)-butanone-1 ("IRGACURE®369", manufactured by Ciba Specialty Chemicals Inc.) and 1-hydroxycyclohexyl phenyl ketone ("IRGACURE® 184", manufactured by Ciba Specialty Chemicals Inc.) were used.

As the hydrated metal compound (D1), aluminum hydroxide: "HIGILITE H-43 STE" (manufactured by SHOWA DENKO K.K.), magnesium hydroxide: "KISUMA 5A" (Kyowa Chemical Industry Co., Ltd.) and hydrotalcite: "DHT-4A" (manufactured by Kyowa Chemical Industry Co., Ltd.) were used. As the brominated epoxy compound (D2), a bisphenol A type brominated epoxy resin: "EPIKOTE E-5050" (bromine content: 49% by weight, epoxy equivalent: 390, manufactured by Japan Epoxy Resin Co., Ltd.), a bisphenol A type brominated epoxy acrylate "NEOPOL 8319S" (bromine content: 41.1% by weight, manufactured by JAPAN U-PICA COMPANY, LTD.), a carboxyl group-containing bisphenol A type brominated epoxy acrylate: "NEOPOL 8318S" (bromine content: 32.2% and acid value of solid content: 82.7 mg KOH/g, manufactured by JAPAN U-PICA COMPANY, LTD.) were used. As the phosphate ester compound (D2), an aromatic condensed phosphate ester: "PX-200" (manufactured by DAIHACHI CHEMICAL INDUSTRY CO., LTD.) and orthophosphate ester: triphenyl phosphate TPP (manufactured by DAIHACHI CHEMICAL INDUSTRY CO., LTD.) were used.

As the thermocurable resin (E), a biphenyl type epoxy resin "YL6121H" (manufactured by Japan Epoxy Resin Co., Ltd.) was used. As the thermal polymerization catalyst (F), melamine (manufactured by NISSAN CHEMICAL INDUSTRIES, LTD) was used.

Test Example 1<Production of Photosensitive Dry Film>

Each of the resin compositions (viscosity: 5,000 mPa·s, 25° C.) prepared in Examples 1 to 10 and Comparative Examples 1 to 4 using methylcellosolve acetate as a solvent was applied on a 23 μm thick film made of polyethylene terephthalate using a doctor blade and was then dried at 80° C. for 7 minutes to form a photosensitive layer. Then, a 25 μm thick polyethylene film (low-density polyethylene film) was laminated thereon to produce a photosensitive dry film with a cover film. The film thickness of the photosensitive layer after drying was 40±1 μm.

<Production of Laminate Specimen>

The cover film of the photosensitive dry film was peeled off and the photosensitive layer was heated to 70° C., while a substrate for evaluation was heated to 60° C. and the photosensitive layer and the substrate for evaluation were laminated using a laminator to obtain a laminate specimen. As the substrate for evaluation, the following substrates (1) and (2) were used.

(1) Substrate obtained by washing a printed board comprising a copper foil (thickness: 35 μm) and a polyimide film (thickness: 50 μm) laminated on one surface of the copper foil ["UPISEL N", manufactured by UBE INDUSTRIES, LTD.] with an aqueous 1% sulfuric acid solution, washing with water and then drying in an air flow.

(2) 25 μm thick polyimide film ["CAPTON® 100H", manufactured by DU PONT—TORAY CO., LTD.]

<Exposure, Development, and Thermocuring of Laminate Specimen>

Each of the resulting laminate specimens was exposed to light at a dose of 500 mJ/cm$^2$, using an exposing machine HMW-680GW [manufactured by Oak Co., Ltd.] equipped with a metal halide lamp.

The non-exposure portion was removed by spraying an aqueous 1 wt % sodium carbonate solution at 30° C. over each laminate specimen for 30 seconds and then spraying water at 30° C. for 30 seconds, thereby conducting the development. Then, a heat treatment was conducted at 150° C. for 30 minutes to obtain a copper-clad laminate (using a substrate (1) for evaluation) and a polyimide laminate (using a substrate (2) for evaluation).

In the production of the samples for evaluation of the photosensitivity and developability, exposure was conducted using a Stouffer 21 step tablet as a negative pattern. In the production of samples for evaluation of the soldering heat resistance, such a negative pattern is used, which enables a copper foil having a square of 1 cm×1 cm and a line/space of 1 mm/1 mm of a length of 2 cm to be remained within a range of 4 cm×6 cm. With respect to electrical insulating properties, IPC-C defined in IPC (Institute for Interconnecting and Packaging Electronic Circuit) Standard was used as the negative pattern. The negative pattern was not used in the production of other samples for evaluation.

<Evaluation of Physical Properties>

Physical properties were evaluated in the following manner. The results are shown in Table 2.

In the following respective evaluations, polyimide laminated plates were evaluated with respect to the "flammability" and "flex resistance", while laminates obtained by forming layers (thickness: 40 μm) made of the respective curable resins of Examples 1 to 8 and Comparative Examples 1 to 4 on commercially available substrates (IPC-C) were used with respect to electrical insulating properties. With respect to other evaluations, copper-clad laminates were evaluated.

Evaluation Items

Flammability

Specimens were made in the following manner. On both surfaces of a polyimide film (manufactured by DU PONT—TORAY CO., LTD., "CAPTON® 100H") having a size of 25 μm in thickness and 200 mm×50 mm, a 40 μm thick curable resin composition layer was formed. After exposing to UV at a dose of 500 mJ/cm$^2$, the thick curable resin composition layer was thermocured at 150° C. for 30 minutes. After conditioning at 70° C. for 168 hours and subjecting to a solder shock treatment in a sand bath at 260° C. for 10 seconds, samples for flame resistance testing were obtained. With respect to the flammability, the flame resistance was evaluated by the method in conformity to Underwriters Laboratories Inc. U.S.A. (abbreviated as UL) Tests For Flammability of Plastic Materials (94UL-VTM).

"VTM" and "NOT" described in Table 2 are based on the following criteria. "VTM-0": Rating that meets all requirements described below (1) Total flaming combustion time for each specimen after the first burner flame application shall not exceed 10 seconds.
(2) Total flaming combustion time for all 5 specimens of any set shall not exceed 50 seconds after applying the tenth burner flame to all 5 specimens of any set.
(3) Flaming or glowing combustion shall not travel for more than 125 mm (mark line) of the specimen.
(4) Cotton shall not ignite by flaming drips from any specimen.
(5) Flaming and glowing combustion time for each specimen after second burner flame application shall not exceed 30 seconds.
(6) In case only one specimen among specimens (each group including 5 specimens) does not meet requirements or total flaming combustion time ranges from 51 to 55 seconds, 5 specimens shall be tested and all specimens shall meet the requirements (1) to (5).

"VTM-1": Rating that meets all requirements described below (1) Total flaming combustion time for each specimen after the first burner flame application shall not exceed 30 seconds.
(2) Total flaming combustion time for all 5 specimens of any set shall not exceed 250 seconds after applying the tenth burner flame to all 5 specimens of any set.
(3) Flaming or glowing combustion shall not travel for more than 125 mm (mark line) of the specimen.
(4) Cotton shall not ignite by flaming drips from any specimen.
(5) Flaming and glowing combustion time for each specimen after second burner flame application shall not exceed 60 seconds.
(6) In case only one specimen among specimens (each group including 5 specimens) does not meet requirements or total flaming combustion time ranges from 251 to 255 seconds, 5 specimens shall be tested and all specimens shall meet the requirements (1) to (5).

"VTM-2": Rating that meets all requirements described below (1) Total flaming combustion time for each specimen after the first burner flame application shall not exceed 30 seconds.

(2) Total flaming combustion time for all 5 specimens of any set shall not exceed 250 seconds after applying the tenth burner flame to all 5 specimens of any set.
(3) Flaming or glowing combustion shall not travel for more than 125 mm (mark line) of the specimen.
(4) Cotton may ignite by flaming drips from any specimen.
(5) Flaming and glowing combustion time for each specimen after second burner flame application shall not exceed 60 seconds.
(6) In case only one specimen among specimens (each group including 5 specimens) does not meet requirements or total flaming combustion time ranges from 251 to 255 seconds, 5 specimens shall be tested and all specimens shall meet the requirements (1) to (5).

"NOT": Case where specimens do not pass all ratings

Photosensitivity

After laying a Stouffer 21 step tablet as a negative pattern on the sample, the sample was exposed to light and developed. The photosensitivity of a curable resin composition was evaluated by measuring the number of steps of the step tablet of the photocured film formed on the resulting copper-clad laminate. The photosensitivity is expressed by the number of steps of the step tablet. The larger the number of steps of the step tablet, the higher the photosensitivity.

Developability

In the evaluation of the photosensitivity, the sample was developed under the conditions of a temperature of 30° C. and a spray pressure of 2 kg/cm² for one minute, using an aqueous 1 wt % sodium carbonate solution as a developing solution. The state of the coating film was visually judged. Symbols in Table 2 are as follows.
○: completely developed
Δ: slight development residue exists
×: development residue exists Flex resistance A polyimide laminate was folded by 180 degrees while making a cured film made of a photosensitive layer to face inside. It was examined whether or not whitening of the cured film occurred.
○: no whitening of cured film
×: whitening of cured film occurred Soldering Heat Resistance In conformity to the method defined in JIS C-6481, a copper-clad laminate was floated on a solder bath at 260° C. for 10 seconds (1 cycle) and this cycle was repeated three times. Then, "blister" and adhesion of the cured film were generally evaluated.
⊚: no change was observed
○: slight change
Δ: less than 10% of cured film was peeled off
×: entire cured film was peeled off Electrical Insulating Properties (Insulating Resistance)

On IPC-C (comb-shaped pattern) of a commercially available substrate (IPC Standard), each of curable resin composition layers of Examples 1 to 8 and Comparative Examples 1 to 4 was formed. The resulting laminate was allowed to stand in an atmosphere at a temperature of 85° C. and a relative humidity of 100% for 192 hours and the insulating properties were evaluated by measuring values of the insulating resistance before and after the treatment. In conformity to JIS C5012, DC 100 V was applied to the substrates before and after the treatment and, after maintaining for one minute, values of the insulating resistance were measured by an insulation resistance tester in the state where the voltage is applied.

Test Example 2

<Production of Laminate Specimen>

Each of the curable resin compositions (viscosity: 20,000 mPa·s) prepared in Examples 1, 2, 8, and 9 and Comparative Examples 1 and 2 using carbitol acetate as a solvent was applied on a substrate for evaluation by a screen printing method so that the film thickness after drying becomes about 40 μm, using a 150 mesh polyester plate. The curable resin composition applied was dried at 70° C. for 30 minutes to produce a laminated specimen. The final film thickness of the photosensitive layer was 40±2 μm. As the substrate for evaluation, the substrates (1) and (2) described above were used. These substrates were also evaluated in the same manner as in Test Example 1. The results are shown in Table 2.

TABLE 1

| | | Examples | | | | | | | | | |
|---|---|---|---|---|---|---|---|---|---|---|---|
| | | 1 | 2 | 3 | 4 | 5 | 6 | 7 | 8 | 9 | 10 |
| (A) | EA-1 | 34.0 | 34.0 | 34.0 | 20.0 | | | | | | |
| | UA-1 | | | | 10.0 | 30.0 | 30.0 | 30.0 | 16.0 | 16.0 | 16.0 |
| | UA-2 | | | | | | | | 12.0 | 12.0 | 8.0 |
| (B) | Epoxy acrylate SP-4010 | 8.0 | 8.0 | 8.0 | | | | | | | |
| | Urethane acrylate EB-1290K | | | | 14.0 | 14.0 | 14.0 | 14.0 | 14.0 | 8.0 | 8.0 |
| (C) | Photopolymerization initiator 1 (TPO) | 2.0 | 2.0 | 2.0 | 1.0 | 1.0 | 1.0 | 1.0 | 1.0 | 1.0 | 1.0 |
| | Photopolymerization initiator 2 (EAB-F) | 2.0 | 2.0 | 2.0 | 1.0 | 1.0 | 1.0 | 1.0 | 1.0 | 1.0 | 1.0 |
| | Photopolymerization initiator 3 (IRGACURE ® 184) | | | | 1.0 | 1.0 | 1.0 | 1.0 | 1.0 | 1.0 | 1.0 |
| (D1) | Aluminum hydroxide | 18.0 | | | 18.0 | 22.0 | 22.0 | | 22.0 | 22.0 | 22.0 |
| | Magnesium hydroxide | | 18.0 | | | | | 22.0 | | 22.0 | 22.0 |
| | Hydrotalcite | | | 18.0 | | | | | | | |
| (D2) | EPIKOTE5050 | 18.0 | 18.0 | 18.0 | 18.0 | 22.0 | 22.0 | 22.0 | 22.0 | | |
| | NEOPOL 8319S | | | | | | | | | 14.0 | |
| | NEOPOL 8318S | | | | | | | | | | 18.0 |
| (D3) | PX-200 | 4.5 | 4.5 | 4.5 | 4.5 | 5.0 | | 5.0 | 5.0 | 4.0 | 4.0 |
| | TPP | | | | | | 5.0 | | | | |
| (E) | Epoxy resin | 10.0 | 10.0 | 10.0 | 10.0 | 10.0 | 10.0 | 10.0 | 10.0 | 10.0 | 10.0 |
| (F) | Melamine | 1.0 | 1.0 | 1.0 | 1.0 | 1.0 | 1.0 | 1.0 | 1.0 | 1.0 | 1.0 |

TABLE 1-continued

| | | | Comparative Examples | | | |
|---|---|---|---|---|---|---|
| | | | 1 | 2 | 3 | 4 |
| (A) | EA-1 | | 34.0 | 34.0 | | |
| | UA-1 | | | | 30.0 | 16.0 |
| | UA-2 | | | | | 12.0 |
| (B) | Epoxy acrylate SP-4010 | | 8.0 | 8.0 | | |
| | Urethane acrylate EB-1290K | | | | 14.0 | 14.0 |
| (C) | Photopolymerization initiator 1 (TPO) | | 2.0 | 2.0 | 1.0 | 1.0 |
| | Photopolymerization initiator 2 (EAB-F) | | 2.0 | 2.0 | 1.0 | 1.0 |
| | Photopolymerization initiator 3 (IRGACURE ® 184) | | | | 1.0 | 1.0 |
| (D1) | Aluminum hydroxide | | 18.0 | | 22.0 | 22.0 |
| | Magnesium hydroxide | | | 18.0 | | |
| | Hydrotalcite | | | | | |
| (D2) | EPIKOTE 5050 | | | 18.0 | 22.0 | |
| | NEOPOL 8319S | | | | | |
| | NEOPOL 8318S | | | | | |
| (D3) | PX-200 | | | | | 5.0 |
| | TPP | | | | | |
| (E) | Epoxy resin | | 10.0 | 10.0 | 10.0 | 10.0 |
| (F) | Melamine | | 1.0 | 1.0 | 1.0 | 1.0 |

TABLE 2

| | Flammability 94VTM | Photo-sensitivity | Develop-ability | Flex resistance | Soldering heat resistance | | Insulating resistance | |
|---|---|---|---|---|---|---|---|---|
| | | | | | 1 cycle | 3 cycles | Before treatment (Ω) | After treatment (Ω) |
| Test Example 1 (Film) | | | | | | | | |
| Example 1 | VTM-0 | 12 | ○ | ○ | ◎ | ◎ | $1.6 \times 10^{14}$ | $2.3 \times 10^{11}$ |
| Example 2 | VTM-0 | 11 | ○ | Δ | ◎ | ◎ | $8.1 \times 10^{13}$ | $4.4 \times 10^{10}$ |
| Example 3 | VTM-0 | 10 | ○ | ○ | ◎ | ◎ | $1.6 \times 10^{14}$ | $8.1 \times 10^{10}$ |
| Example 4 | VTM-0 | 11 | ○ | ○ | ◎ | ◎ | $3.8 \times 10^{14}$ | $4.5 \times 10^{10}$ |
| Example 5 | VTM-0 | 9 | ○ | ○ | ◎ | ○ | $1.5 \times 10^{14}$ | $2.9 \times 10^{11}$ |
| Example 6 | VTM-0 | 9 | ○ | ○ | ◎ | Δ | $4.6 \times 10^{14}$ | $8.8 \times 10^{9}$ |
| Example 7 | VTM-0 | 8 | ○ | ○ | ◎ | ○ | $4.4 \times 10^{14}$ | $6.9 \times 10^{10}$ |
| Example 8 | VTM-0 | 10 | ○ | ○ | ◎ | ○ | $7.5 \times 10^{13}$ | $2.9 \times 10^{12}$ |
| Example 9 | VTM-0 | 14 | ○ | ○ | ◎ | ◎ | $3.0 \times 10^{13}$ | $8.7 \times 10^{11}$ |
| Example 10 | VTM-0 | 14 | ○ | Δ | ◎ | ◎ | $4.1 \times 10^{13}$ | $1.6 \times 10^{12}$ |
| Comparative Example 1 | NOT | 12 | ○ | X | ◎ | Δ | $8.0 \times 10^{13}$ | $4.6 \times 10^{10}$ |
| Comparative Example 2 | NOT | 12 | ○ | X | ◎ | ◎ | $3.8 \times 10^{14}$ | $2.2 \times 10^{11}$ |
| Comparative Example 3 | NOT | 8 | ○ | X | ◎ | Δ | $8.0 \times 10^{13}$ | $4.9 \times 10^{10}$ |
| Comparative Example 4 | NOT | 10 | ○ | ○ | ○ | X | $5.6 \times 10^{13}$ | $4.6 \times 10^{10}$ |
| Test Example 2 (Ink) | | | | | | | | |
| Example 1 | VTM-0 | 13 | ○ | ○ | ◎ | ○ | $2.1 \times 10^{14}$ | $8.3 \times 10^{10}$ |
| Example 2 | VTM-0 | 12 | ○ | ○ | ◎ | ○ | $1.7 \times 10^{13}$ | $4.9 \times 10^{11}$ |
| Example 8 | VTM-0 | 10 | ○ | ○ | ◎ | ○ | $7.5 \times 10^{13}$ | $6.0 \times 10^{11}$ |
| Example 9 | VTM-0 | 10 | ○ | ○ | ◎ | ○ | $3.0 \times 10^{13}$ | $8.7 \times 10^{11}$ |
| Comparative Example 1 | NOT | 12 | ○ | X | ◎ | Δ | $5.0 \times 10^{14}$ | $8.6 \times 10^{10}$ |
| Comparative Example 2 | NOT | 12 | ○ | X | ◎ | ○ | $8.9 \times 10^{12}$ | $9.6 \times 10^{9}$ |

Examples 11 to 18 and Comparative Examples 5 to 8

According to the formulation (parts by weight) shown in Table 3, <EA-1>, <UA-1> and <UA-2> prepared in Preparation Examples 1 to 3 as a photosensitive prepolymer (A-2) having a carboxyl group, a compound having an ethylenically unsaturated group (B), a photopolymerization initiator (C), a hydrated metal compound, a brominated epoxy compound, a phosphate ester compound, a thermocurable resin (E) and a thermal polymerization catalyst (F) were mixed to prepare a curable resin composition. Although the solvent is used in the synthesis of the photosensitive prepolymer and the preparation of the composition, the amount of all components shown in Table 3 is expressed in terms of solid content after drying.

As the compound having an ethylenically unsaturated group (B), a dipentaerythritol hexaacrylate "M-400" (manufactured by TOAGOSEI CO, LTD.) and a urethane acrylate "EB1290K" (manufactured by DAICEL CHEMICAL INDUSTRIES, LTD) were used.

As the photopolymerization initiator (C), 2,4,6-trimethylbenzoylphenylphosphine oxide "TPO" (photopolymerization initiator 1) manufactured by BASF CO., 2-benzyl-2-dimethylamino 1-(4-morpholinophenyl)-butanone-1 (trade name: "IRGACURE® 369") (photopolymerization initiator 2) manufactured by Ciba Specialty Chemicals Inc. and 1-hydroxycyclohexyl phenyl ketone (trade name: "IRGA- CURE® 184") (photopolymerization initiator 3) manufactured by Ciba Specialty Chemicals Inc. were used.

<Aluminum Hydroxide 1, 2 and 3>

As the hydrated metal compound, an aluminum hydroxide "HIGILITE H-43M" (manufactured by SHOWA DENKO K.K.) [average particle diameter determined by calculating from a ratio of a major axis to a minor axis after observing a secondary electron image at an acceleration voltage of 20 kV using a scanning electron microscope (JSM-5500LV, manufactured by JEOL):0.6 μm] was used. As the surface treating agent, three kinds of (1) stearic acid (amphipathic compound: reagent manufactured by JUNSEI CHEMICAL CO., LTD.), (2) 3-glycidoxypropyltrimethoxysilane "A-187" (silane coupling agent, manufactured by Nippon Unicar Co., Ltd.), and (3) 3-mercaptopropyltrimethoxysilane "A-189" (silane coupling agent, manufactured by Nippon Unicar Co., Ltd.) were used. Aluminum hydroxides surface-treated with the surface treating agents (1) to (3) are respectively designated aluminum hydroxides 1, 2 and 3.

The surface treatment was conducted in the following manner. When using stearic acid, aluminum hydroxide and stearic acid (3% by weight) were fed in a 20 L Henschel mixer and stearic acid was dissolved by heating to 100° C.±5° C. while stirring, thereby surface-treating the aluminum hydroxide.

In the case of the silane coupling agent, the silane coupling agent was weighed in the amount of 1% by weight based on the amount of aluminum hydroxide and was then diluted four times with a solution of water and an alcohol in a ratio of 1/9 (vol/vol). A 10 wt % water dispersion of aluminum hydroxide was prepared and the silane coupling agent was introduced while stirring. After completely introducing the silane coupling agent, the mixture was stirred for 5 hours, filtered and then vacuum-dried at 80° C. for 12 hours to obtain a sample. With respect to 3-glycidoxypropyltrimethoxysilane "A-187", the treatment was conducted by heating the Henschel mixer to 80° C. after introducing a silane coupling agent without using a diluent.

<Hydrotalcite 1 and 2>

(1) Using magnesium nitrate, aluminum nitrate and sodium hydroxide as a raw material, a hydrotalcite was synthesized according to the method described in the literature [S. Miyata, Clays & Clay Minerals, 23, 369–375 (1975)]. The hydrotalcite was aged at a dropping rate of sodium hydroxide of 50 ml/min at 60° C. for 6 hours to obtain a hydrotalcite (non-treated product) of the structural formula: $[Mg_{0.7}Al_{0.3}(OH)_2(NO_3)_{1.0}.0.6H_2O]$ which contains nitric acid ions as interlayer ions. With respect to the particle size of this single crystal grain, the average particle diameter determined by calculating from a ratio of a major axis to a minor axis after observing a secondary electron image at an acceleration voltage of 120 kV using a transmission electron microscope (CX200, manufactured by JEOL) was 0.4 μm.

This hydrotalcite crystal was mixed with 3% by weight of stearic acid and the mixture was heated to 100° C. while stirring in a Henschel mixer, and then stirred for 5 minutes to obtain a sample (hydrotalcite 1).

(2) An aqueous solution of D,L-phenylalanine (reagent, manufactured by JUNSEI CHEMICAL CO., LTD.) having a pH of 10 adjusted by sodium hydroxide was added dropwise in an aqueous mixed solution of magnesium nitrate and aluminum nitrate in a molar ratio of 3:1, thereby to coprecipitate a hydrotalcite which contains D, L-phenylalanine ions as interlayer ions. Sodium hydroxide was appropriately added dropwise in the mixed solution and, after maintaining at pH 10 and aging at 60° C. for 6 hours, washing and filtration were repeated. Then, the resulting product was dried and ground to obtain a sample (hydrotalcite 2).

As the brominated epoxy compound, a bisphenol A type brominated epoxy resin "EPIKOTE E-5050" (manufactured by Japan Epoxy Resin Co., Ltd.) was used. As the phosphate ester compound, an aromatic condensed phosphate ester "PX-200" (manufactured by DAIHACHI CHEMICAL INDUSTRY CO., LTD.) was used.

As the thermocurable resin (E), a biphenyl type epoxy resin "YL6121H" (manufactured by Japan Epoxy Resin Co., Ltd.) was used. As the thermal polymerization catalyst (F), melamine (manufactured by NISSAN CHEMICAL INDUSTRIES, LTD.) was used.

<Production of Photosensitive Dry Film>

With respect to Examples 11 to 18 and Comparative Examples 5 to 8, photosensitive dry films were produced in the same manner as in Examples 1 to 10 and Comparative Examples 1 to 4.

<Production of Laminate Specimen>

With respect to Examples 11 to 18 and Comparative Examples 5 to 8, laminate specimens were produced in the same manner as in Examples 1 to 10 and Comparative Examples 1 to 4.

<Exposure, Development, and Thermocuring of Laminate Specimen>

The respective laminate specimens thus obtained were exposed to light at a dose of 500 mJ/cm$^2$ using an exposing machine HMW-680GW [manufactured by Oak Co., Ltd.] equipped with a metal halide lamp.

The non-exposed portion was removed by developing with an aqueous 1 wt % sodium carbonate solution at 30° C. for one minute. After the development, a heat treatment was conducted at 150° C. for 30 minutes to obtain a copper-clad laminate (using a substrate (1) for evaluation) and a polyimide laminate (using a substrate (2) for evaluation).

In the production of the samples for evaluation of the photosensitivity and developability, exposure was conducted using a 21 step tablet manufactured by Hitachi Chemical Co., Ltd., as a negative pattern.

<Evaluation of Physical Properties>

Physical properties were evaluated in the following manner. The results are shown in Table 4.

Flammability

In the same manner as in Examples 1 to 10, Comparative Examples 1 to 4, except that a test was once conduced using five specimens (1 set), and furthermore, the total time required to fire extinguishing of five specimens and the number of the fire extinguishing test of five specimens were counted for comparing the flame resistance.

Photosensitivity

After laying a 21 step tablet manufactured by Hitachi Chemical Co., Ltd., as a negative pattern on the sample, the sample was exposed to light at a dose of 500 mJ/cm$^2$. Then, the non-exposure portion was removed by developing with an aqueous 1 wt % sodium carbonate solution at 30° C. for one minute and the photosensitivity of a curable resin composition was evaluated by measuring the number of steps of the step tablet of the photocured film formed on the resulting copper-clad laminate.

Developability

With respect to Examples 11 to 18 and Comparative Examples 5 to 8, evaluation was conducted in the same manner as in Examples 1 to 10 and Comparative Examples 1 to 4.

Folding Resistance

The sample was produced by laminating a resist on both surfaces of a 25 μm thick polyimide film and cutting a specimen obtained by exposure, development, and curing of the sample into pieces having a width of 15 mm and a length of 110 mm. In conformity to the folding resistance test defined in JIS C5016, the folding resistance was evaluated by using a MIT flex fatigue testing machine, Model S, manufactured by Toyo Seiki Co., Ltd. The sample was mounted to a folding device (distance: 0.25 mm, R=0.38) and was repeatedly folded from side to side at a load of 4.9 N, folding angle of 135° and a rate of 175 cpm.

The folding test was temporarily stopped every 10 times of folding and the folded portion of each sample was observed by a microscope. The maximum number of times of folding was counted until the resist film was cracked.

INDUSTRIAL APPLICABILITY

The resist curable resin composition of the present invention can form a protective film, which has good photosensitivity and alklai developability and also has excellent flame resistance, pliability, and soldering heat resistance. Particularly, it can be preferably used to form a cover-layer for FPC, or a solder resist.

The invention claimed is:

1. A resist curable resin composition comprising a resist curable resin material, a hydrated metal compound, a phosphate ester compound, and a brominated epoxy compound, wherein
   the hydrated metal compound is surface-treated with a surface treating agent having at least one of an amphipathic property and a polarity,
   the resist curable resin material is a photocurable resin material comprising a photosensitive prepolymer having an ethylenically unsaturated terminal group originating in an acrylic monomer, a compound having an

TABLE 3

| | | Examples | | | | | | | | Comparative Examples | | | |
|---|---|---|---|---|---|---|---|---|---|---|---|---|---|
| | | 11 | 12 | 13 | 14 | 15 | 16 | 17 | 18 | 5 | 6 | 7 | 8 |
| (A) | EA-1 | 34.0 | 34.0 | 34.0 | — | — | 34.0 | 34.0 | — | 34.0 | 34.0 | — | — |
| | UA-1 | — | — | — | 16.0 | 16.0 | — | — | 16.0 | — | — | 16.0 | 16.0 |
| | UA-2 | — | — | — | 12.0 | 12.0 | — | — | 12.0 | — | — | 12.0 | 12.0 |
| (B) | Dipenaerythritol (M-400) | 8.0 | 8.0 | 8.0 | 3.0 | 3.0 | 8.0 | 8.0 | 3.0 | 8.0 | 8.0 | 3.0 | 3.0 |
| | Urethane acrylate (EB1290K) | — | — | — | 6.0 | 6.0 | — | — | 6.0 | — | — | 6.0 | 6.0 |
| (C) | Photopolymerization initiator 1 | 1.0 | 1.0 | 1.0 | 1.0 | 1.0 | 1.0 | 1.0 | 1.0 | 1.0 | 1.0 | 1.0 | 1.0 |
| | Photopolymerization initiator 2 | 1.0 | 1.0 | 1.0 | 1.0 | 1.0 | 1.0 | 1.0 | 1.0 | 1.0 | 1.0 | 1.0 | 1.0 |
| | Photopolymerization initiator 3 | 1.0 | 1.0 | 1.0 | 1.0 | 1.0 | 1.0 | 1.0 | 1.0 | 1.0 | 1.0 | 1.0 | 1.0 |
| (D1) | Aluminum hydroxide 1 | 16.0 | — | — | — | — | — | — | — | — | — | — | — |
| | Aluminum hydroxide 2 | — | 16.0 | — | 16.0 | — | — | — | — | — | — | — | — |
| | Aluminum hydroxide 3 | — | — | 16.0 | — | 16.0 | — | — | — | — | — | — | — |
| | Aluminum hydroxide (H-43M) | — | — | — | — | — | — | — | — | 16.0 | — | 16.0 | — |
| | Hydrotalcite 1 | — | — | — | — | — | 20.0 | — | — | — | — | — | — |
| | Hydrotalcite 2 | — | — | — | — | — | — | 20.0 | 20.0 | — | — | — | — |
| | Hydrotalcite (untreated product) | — | — | 18.0 | — | — | — | — | — | — | 20.0 | — | 20.0 |
| (D2) | Brominated epoxy resin (E-5050) | 12.0 | 12.0 | 12.0 | 12.0 | 12.0 | 12.0 | 12.0 | 12.0 | 12.0 | 12.0 | 12.0 | 12.0 |
| (D3) | Phosphate ester (PX-200) | 6.0 | 6.0 | 6.0 | 3.4 | 3.4 | 6.0 | 6.0 | 3.4 | 6.0 | 6.0 | 3.4 | 3.4 |
| (E) | Epoxy resin (YL6121H) | 6.0 | 6.0 | 6.0 | 6.0 | 6.0 | 6.0 | 6.0 | 6.0 | 6.0 | 6.0 | 6.0 | 6.0 |
| (F) | Melamine | 1.0 | 1.0 | 1.0 | 1.0 | 1.0 | 1.0 | 1.0 | 1.0 | 1.0 | 1.0 | 1.0 | 1.0 |

TABLE 4

| | Combustion test | | | Photo-sensitivity | Developability | Folding resistance (times) |
|---|---|---|---|---|---|---|
| | Fire extinguishing test Number of pieces/5 | Total flaming time (sec) | 94VTM-class | | | |
| Example 11 | 5 | 5.2 | VTM-0 | 14 | ○ | 80 |
| Example 12 | 5 | 7.4 | VTM-0 | 14 | ○ | 80 |
| Example 13 | 5 | 8.2 | VTM-0 | 12 | ○ | 70 |
| Example 14 | 5 | 17.4 | VTM-0 | 12 | ○ | 150 |
| Example 15 | 5 | 15.3 | VTM-0 | 12 | ○ | 100 |
| Example 16 | 5 | 14.8 | VTM-0 | 13 | ○ | 80 |
| Example 17 | 5 | 26.9 | VTM-0 | 14 | ○ | 90 |
| Example 18 | 5 | 23.3 | VTM-0 | 11 | ○ | 220 |
| Comparative Example 5 | 5 | 20.7 | VTM-0 | 14 | ○ | 20 |
| Comparative Example 6 | 5 | 42.8 | VTM-0 | 12 | ○ | 40 |
| Comparative Example 7 | 5 | 45.5 | VTM-0 | 12 | ○ | 60 |
| Comparative Example 8 | 3 | 53.6 | NOT | 10 | ○ | 60 | ethylenically unsaturated group excluding the photosensitive prepolymer, and a photopolymerization initiator, and the brominated epoxy compound is a tetrabromobisphenol A type epoxy resin having an epoxy equivalent of 200 to 3000 and a bromine content of 40 to 60% by weight or a polyfunctional epoxy (meth)acrylate compound having a bromine content of 30 to 60% by weight.

2. A resist curable resin composition according to claim 1, wherein the photosensitive prepolymer has both a carboxyl group and at least two ethylenically unsaturated bonds in a molecule.

3. A resist curable resin composition according to claim 1, wherein the photosensitive prepolymer is an epoxy (meth) acrylate compound having a carboxyl group.

4. A resist curable resin composition according to claim 3, wherein the epoxy (meth)acrylate compound having a carboxyl group has a solid content of an acid value of 10 mg KOH/g or more.

5. A resist curable resin composition according to claim 1, wherein the photosensitive prepolymer is a urethane (meth) acrylate compound having a carboxyl group.

6. A resist curable resin composition according to claim 5, wherein the urethane (meth)acrylate compound having a carboxyl group has a solid content of an acid value of 5 to 150 mg KOH/g.

7. A resist curable resin composition according to claim 1, wherein the photosensitive prepolymer contains a urethane (meth)acrylate compound having a carboxyl group, which has a solid content of an acid value of 5 mg KOH/g or more and less than 60 mg KOH/g, and a urethane (meth)acrylate compound having a carboxyl group, which has a solid content of an acid value of 60 mg KOH/g or more and 150 mg KOH/g or less.

8. A resist curable resin composition according to claim 1, containing a thermocurable resin and a thermal polymerization catalyst.

9. A resist curable resin composition according to claim 1, wherein the resist curable resin material is a thermocurable resin material.

10. A resist curable resin composition according to claim 1, containing an organic solvent.

11. A resist curable resin composition according to claim 1, wherein endothermy of the hydrated metal compound is 400 J/g or higher upon thermolysis.

12. A resist curable resin composition according to claim 1, wherein the hydrated metal compound is at least one of aluminum hydroxide and magnesium hydroxide.

13. A resist curable resin composition according to claim 1, wherein the hydrated metal compound is incorporated in the amount of 10 to 100 parts by weight based on 100 parts by weight of the resist curable resin material.

14. A resist curable resin composition according to claim 1, wherein the brominated epoxy compound is incorporated in the amount of 10 to 80 parts by weight based on 100 parts by weight of the resist curable resin material.

15. A resist curable resin composition according to claim 1, wherein the phosphate ester compound has pentavalent phosphorus atoms.

16. A resist curable resin composition according to claim 1, wherein the phosphate ester compound has an aromatic group.

17. A resist curable resin composition according to claim 1, wherein the phosphate ester compound is incorporated in the amount of 0.5 to 40 parts by weight based on 100 parts by weight of the resist curable resin material.

18. A resist curable resin composition according to claim 1, having a viscosity of 500 to 500,000 mPa·s (25° C.).

19. A resist curable resin composition according to claim 1, wherein the surface treating agent having an amphipathic property is selected from the group consisting of a saturated fatty acid having 6 or more carbon atoms; an unsaturated fatty acid and a salt thereof; primary amine, secondary amine, and tertiary amine, and a salt thereof; a quaternary ammonium salt; an amine compound; and an amino acid derivative.

20. A resist curable resin composition according to claim 1, wherein the surface treating agent having a polarity is selected from the group consisting of titanate coupling agent, aluminum coupling agent, zircoaluminate coupling agent, and silane coupling agent.

21. A resist curable resin composition according to claim 1, wherein the hydrated metal compound is a hydrotalcite or hydrotalcite-based compound which has a layered crystal structure and has an organic anion between crystal layers.

22. A resist curable resin composition according to claim 21, wherein the organic anion is selected from the group consisting of amino acid, sulfur-containing compound, and nitrogen-containing heterocyclic compound, and a salt thereof.

23. A resist curable resin composition according to claim 1, wherein the hydrated compound has an average particle diameter of 0.1 to 30 μm.

24. A cured article obtained by curing the resist curable resin composition of claim 1.

25. Ink comprising the resist curable resin composition of claim 1 and a colorant.

26. A method for curing a resist curable resin composition, which comprises the steps of:
applying the resist curable resin composition of claim 1 or the ink of claim 25 on a substrate in a thickness of 10 to 100 μm,
drying at a temperature within a range from 60° C. to 100° C. for 5 to 30 minutes to form a film having a thickness of 5 to 70 μm,
exposing the film,
developing the film exposed and
thermocuring the film developed.

27. A dry film comprising a base and a photosensitive layer made of the resist curable resin composition of claim 1 formed on a base.

28. A dry film according to claim 27, wherein the base is a film made of polyester or polyethylene.

29. A method for producing a printed circuit board, which comprises:
a laminating step of laminating the photosensitive layer of the dry film of claim 27 with a substrate,
an exposure step of exposing the photosensitive layer to light,
a development step which follows the exposure step, and
a thermocuring step of thermocuring the photosensitive layer.

30. A method for producing a photosensitive dry film, which comprises the step of applying the resist curable resin composition of claim 1 on a base and drying the resist curable resin composition to form a photosensitive layer.

31. An insulating protective film made of the resist curable resin composition of claim 1.

32. A printed circuit board comprising the insulating protective film of claim 31.

33. A flexible printed circuit board comprising the insulating protective film of claim 31.

34. A resist curable resin composition comprising a resist curable resin material, a hydrated metal compound, and a brominated epoxy compound, wherein the hydrated metal compound is surface-treated with a surface treating agent having at least one of an amphipathic property and a polarity, and the brominated epoxy compound is a tetrabromobisphenol A type epoxy resin having an epoxy equivalent of 200 to 3000 and a bromine content of 40 to 60% by weight.

35. A resist curable resin composition comprising a resist curable resin material, a hydrated metal compound, and a brominated epoxy compound, wherein the hydrated metal compound is surface-treated with a surface treating agent having at least one of an amphipathic property and a polarity, and the brominated epoxy compound is a polyfunctional epoxy (meth)acrylate compound having a bromine content of 30 to 60% by weight.

* * * * *